(12) United States Patent
Sakamoto

(10) Patent No.: US 6,387,768 B1
(45) Date of Patent: May 14, 2002

(54) METHOD OF MANUFACTURING A SEMICONDUCTOR COMPONENT AND SEMICONDUCTOR COMPONENT THEREOF

(75) Inventor: Kurt Sakamoto, Chandler, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/649,782

(22) Filed: Aug. 29, 2000

(51) Int. Cl.[7] ............................................. H01L 21/331
(52) U.S. Cl. ........................................ 438/367; 433/309
(58) Field of Search ................................ 438/209, 329, 438/362, 369, 366

(56) References Cited

U.S. PATENT DOCUMENTS

| | | | | |
|---|---|---|---|---|
| 4,885,614 A | * | 12/1989 | Furukawa et al. ............. | 257/76 |
| 4,994,400 A | * | 2/1991 | Yamaguchi et al. .......... | 438/367 |
| 5,026,663 A | * | 6/1991 | Zdebel et al. ................. | 438/556 |
| 5,336,632 A | * | 8/1994 | Imamura ....................... | 438/329 |
| 5,374,846 A | * | 12/1994 | Takemura ..................... | 257/592 |
| 5,496,745 A | * | 3/1996 | Ryum et al. .................. | 438/359 |
| 5,508,553 A | * | 4/1996 | Nakamura et al. ........... | 257/576 |
| 5,523,244 A | * | 6/1996 | Vu et al. ....................... | 438/366 |
| 5,721,147 A | * | 2/1998 | Yoon ............................ | 438/367 |
| 5,798,277 A | * | 8/1998 | Ryum et al. .................. | 438/318 |
| 5,818,100 A | | 10/1998 | Grider et al. ................. | 257/616 |

* cited by examiner

Primary Examiner—John F. Niebling
Assistant Examiner—Christopher Lattin

(57) ABSTRACT

A method of manufacturing a semiconductor component includes providing a substrate (110), an electrically insulative layer (710 or 810) over the substrate, and an electrically conductive layer (820) over the electrically insulative layer. A hole (1510) is etched into a portion (910) of the electrically conductive layer and into a portion of the electrically insulative layer. Another electrically conductive layer (1710) is deposited in the hole, and the two electrically conductive layers are etched to leave a portion (1810) of the second electrically conductive layer in the hole. Then, an additional electrically conductive layer (1910) is grown over the substrate and over the portion of the second electrically conductive layer.

9 Claims, 26 Drawing Sheets ically insulative layer 420 is deposited in trenches 310 and
over electrically insulative layer 240. As an example, layer

METHOD OF MANUFACTURING A SEMICONDUCTOR COMPONENT AND SEMICONDUCTOR COMPONENT THEREOF

FIELD OF THE INVENTION

This invention relates, in general, to electronics, and more particularly, to methods of manufacturing semiconductor components and semiconductor components thereof.

BACKGROUND OF THE INVENTION

Bipolar transistors are used in many different electronic applications, including integrated circuits and discrete components. Homojunction bipolar transistors have limited high frequency applications because their transit frequency ($f_T$) is typically well below 40 GigaHertz (GHz). Heterojunction Bipolar Transistors (HBT) have superior high frequency characteristics because their $f_T$ is greater than that for homojunction bipolar transistors. In many instances, the $f_T$ of an HBT is 100 GHz or higher.

As an example, a HBT can include a silicon substrate and a silicon germanium carbon layer contacting the silicon substrate. The interface between the silicon substrate and the silicon germanium carbon layer forms the heterojunction. However, existing methods for manufacturing HBTs do not produce HBTs exhibiting superior high frequency characteristics.

Accordingly, a need exists for a method of manufacturing a semiconductor component where the method is compatible with existing semiconductor processing techniques and where the method produces a semiconductor component that has superior high frequency performance characteristics.

BRIEF DESCRIPTION OF THE DRAWINGS

The invention will be better understood from a reading of the following detailed description, taken in conjunction with the accompanying drawing figures in which.

Figure 1:
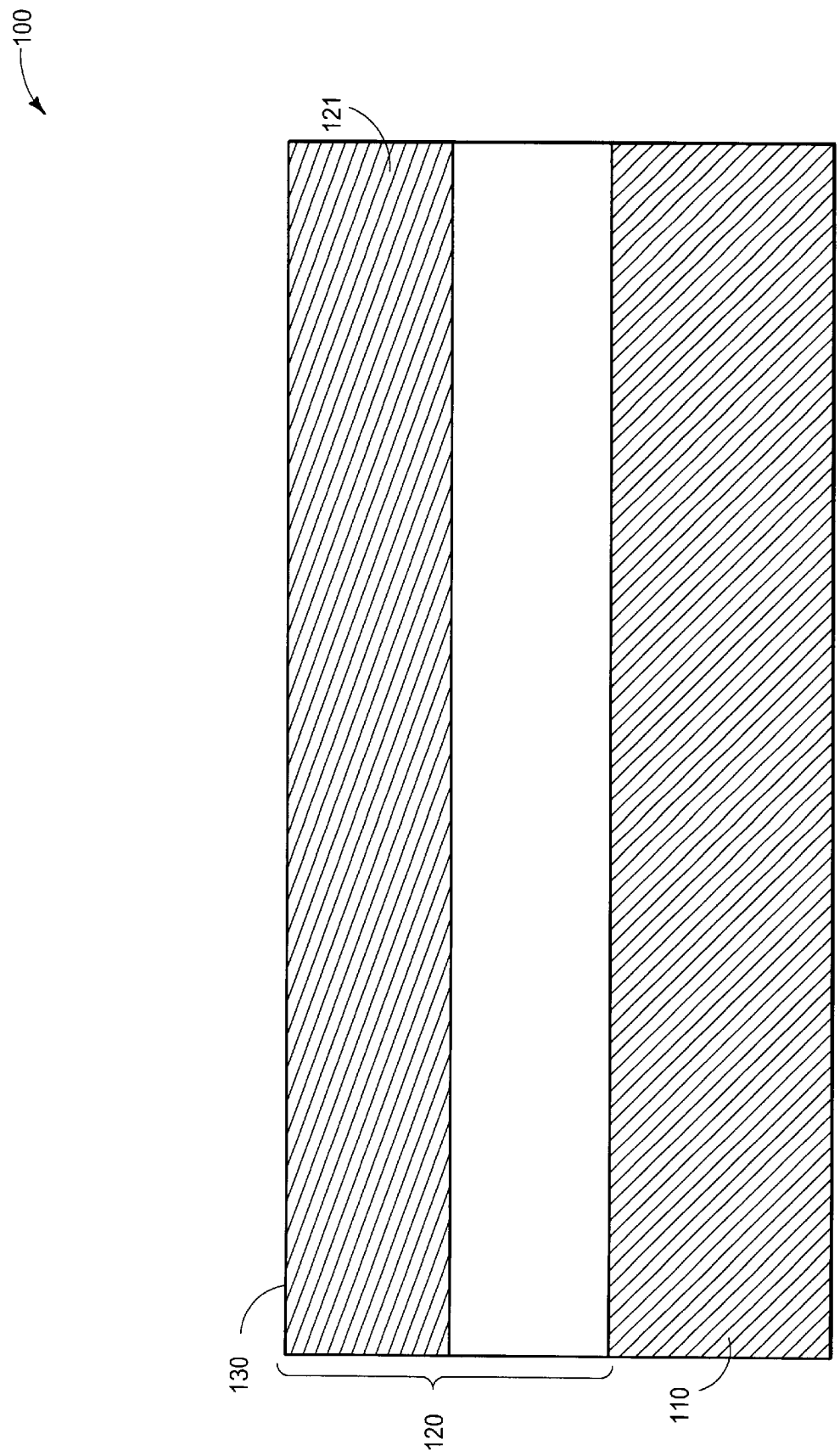
FIGS. 1 through 25 illustrate cross-sectional views of a semiconductor component after different steps of a manufacturing process in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, fourth, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein.

Moreover, the terms front, back, top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than described or illustrated herein.

DETAILED DESCRIPTION OF THE DRAWINGS

FIGS. 1 through 25 illustrate cross-sectional views of a semiconductor component 100 after different steps of a manufacturing process. Semiconductor component 100 can be an integrated circuit including at least one HBT. In the preferred embodiment, however, semiconductor component 100 is a discrete HBT.

As illustrated in FIG. 1, a substrate 110 is provided. Substrate 110 is comprised of silicon. As an example, substrate 110 can have a P+ doping concentration to lower the resistivity of substrate 110 to approximately 0.09 to 0.11 ohm-centimeters (ohm-cm). Substrate 110 can include an undoped silicon epitaxial layer 120. At least a portion of epitaxial layer 120 of substrate 110 will form an emitter region for the HBT in component 100.

An implant screen layer 130 is formed over epitaxial layer 120. As an example, layer 130 can be thermally grown over layer 120. Layer 130 can be comprised of silicon dioxide.

A high implant concentration of an n-type dopant is implanted through layer 130 and into a top portion of epitaxial layer 120 to form a buried layer 121 within epitaxial layer 120. Layer 121 serves as a buried collector region for the HBT in electronic component 100. Substrate 110 is subsequently annealed to activate the implanted dopants within epitaxial layer 120.

Figure 2:
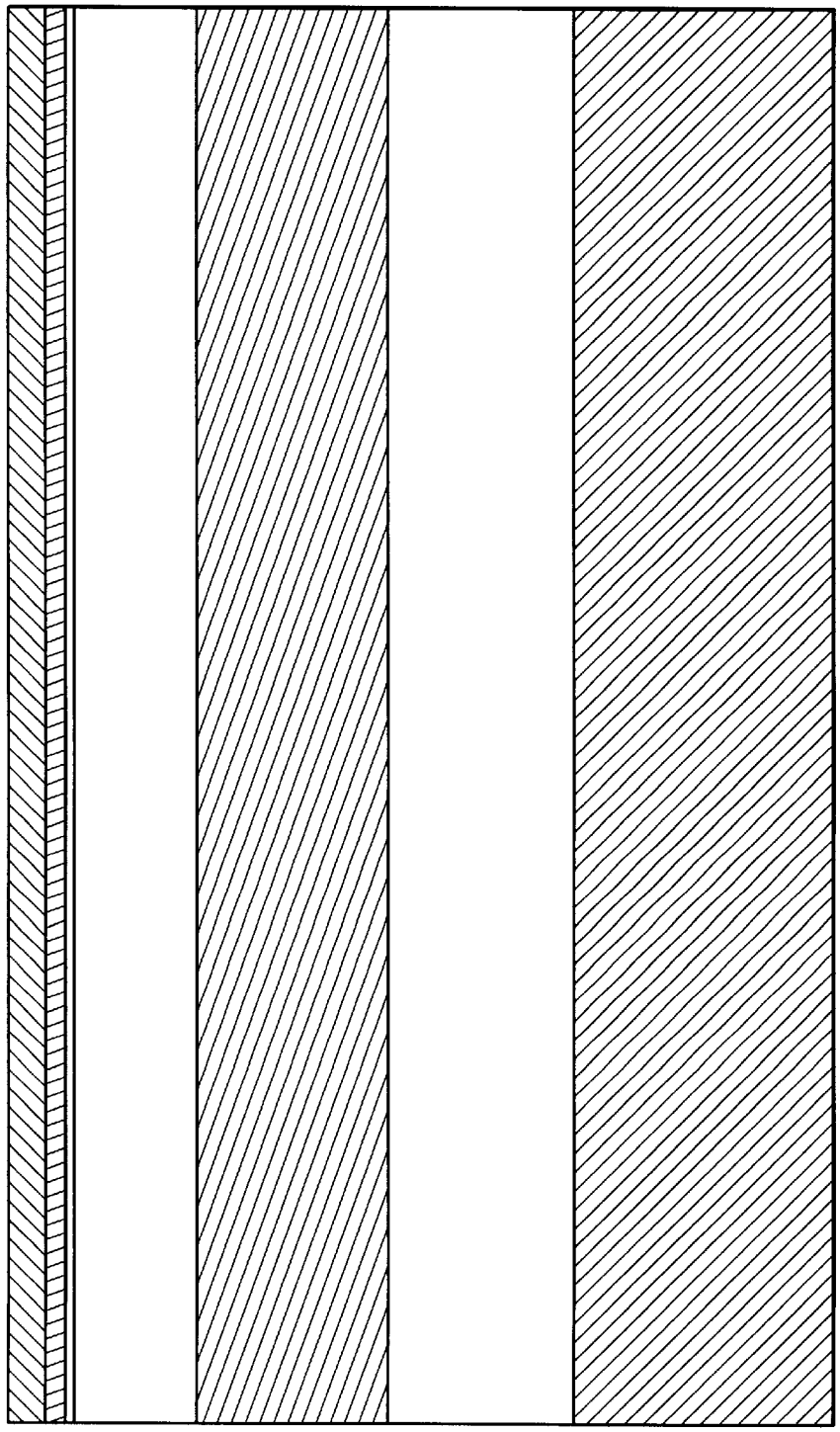

Turning to FIG. 2, implant screen layer 130 of FIG. 1 is removed prior to growing an n-type epitaxial layer 210 over epitaxial layer 120. Layer 210 has a lower doping concentration than buried layer 121 and the bottom portion of substrate 110. As an example, layer 210 can have an n-type doping concentration of approximately $2 \times 10^{16}$ atoms per centimeter cubed ($cm^{-3}$) and can have a thickness of approximately one micrometer. Layer 210 can be considered part of substrate 110.

Next, four electrically insulative layers 220, 230, 240, and 250 can be formed sequentially over epitaxial layer 210. As an example, layer 220 can be comprised of silicon dioxide and can be thermally grown over epitaxial layer 210 to a thickness of approximately 15 nanometers, and layer 230 can be comprised of undoped polycrystalline silicon (polysilicon) and can be deposited to a thickness of approximately 50 nanometers. Furthermore, layer 240 can be comprised of silicon nitride and can be deposited to a thickness of approximately 150 nanometers, and layer 250 can be comprised of Tetra-Ethyl-Ortho-Silicate (TEOS) and can be deposited to a thickness of approximately 300 nanometers. Layer 250 serves as a hardmask during a subsequent trench etching process.

Figure 3:
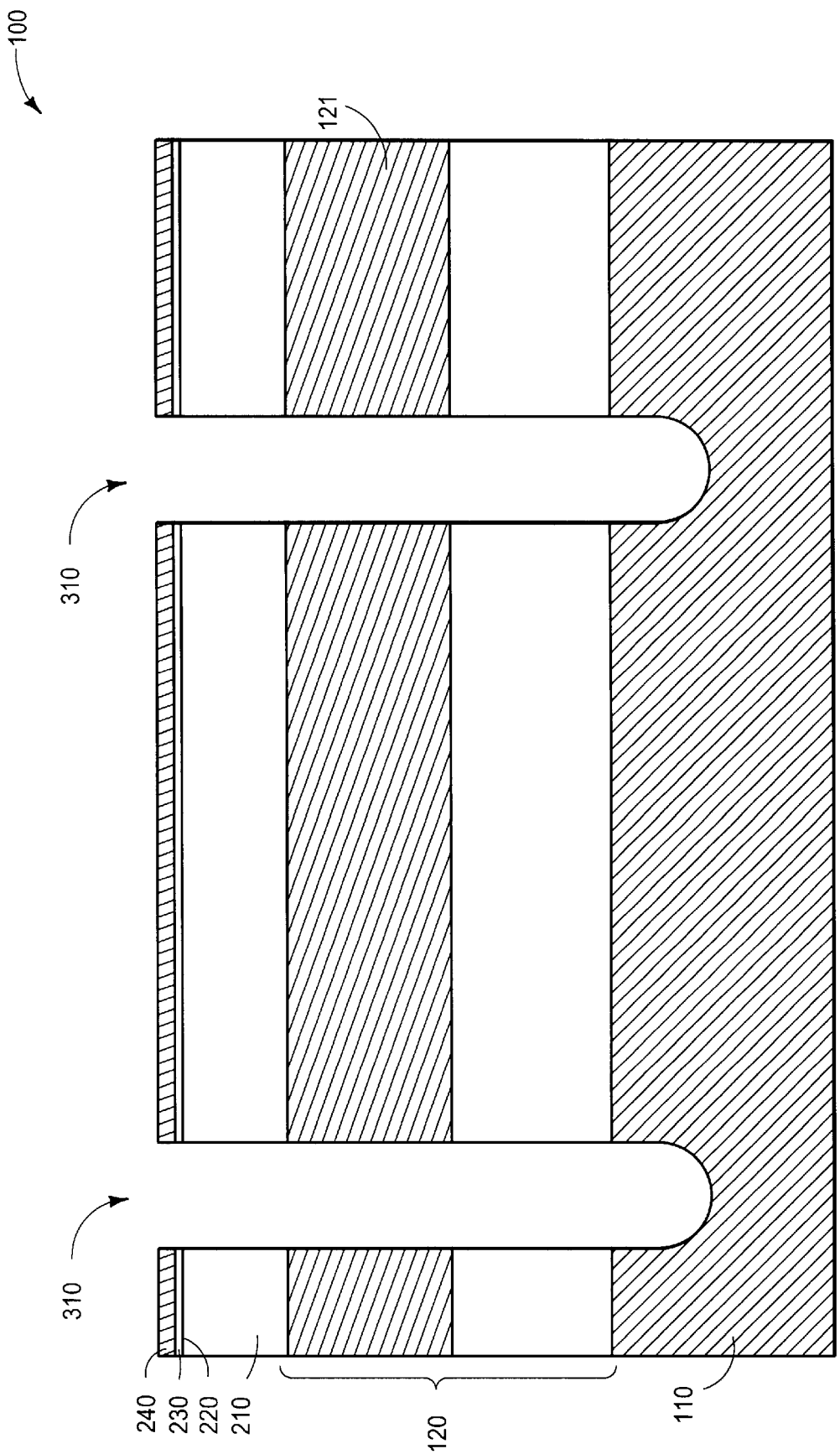

In FIG. 3, layer 250 is patterned and is subsequently used as an etch mask to etch trenches 310 sequentially into layers 240, 230, 220, 210, and 120. Trenches 310 also preferably extend into the portion of substrate 110 located immediately below epitaxial layer 120. As an example, trenches 310 can have a depth of approximately 4.5 to 5 micrometers. In the preferred 10 embodiment, trenches 310 are formed using a Reactive Ion Etch (RIE) process to form substantially parallel side walls for trenches 310.

Figure 4:
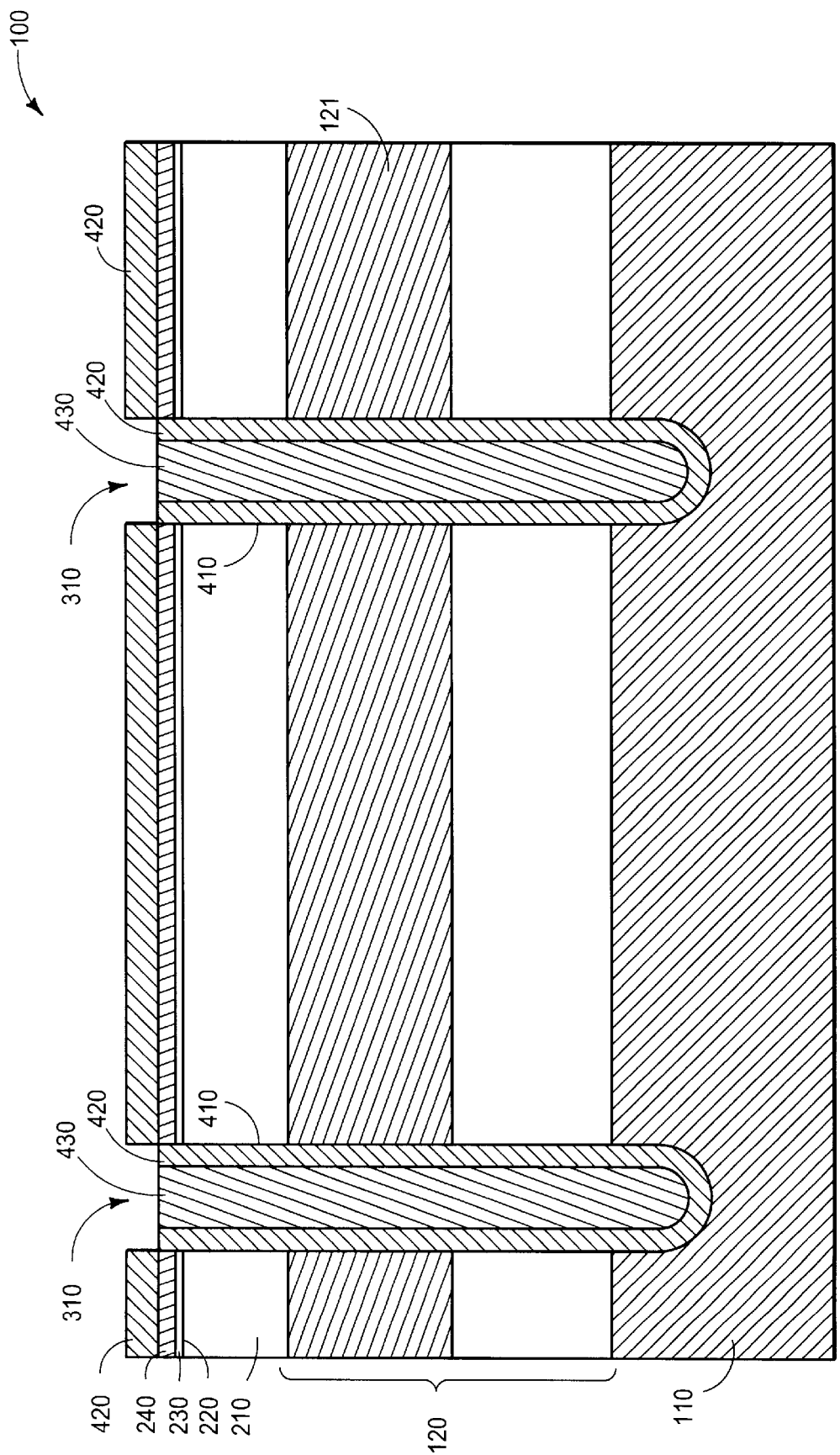

Next, as illustrated in FIG. 4, the semiconductor structure is annealed to grow a layer 410 of silicon dioxide on the side walls of trenches 310. As an example, layer 410 can have a thickness of approximately 50 nanometers. Then, an electrically insulative layer 420 is deposited in trenches 310 and over electrically insulative layer 240. As an example, layer 420 can be comprised of 300 nanometers of TEOS. Subsequently, a layer 430 of polysilicon is deposited in trenches 310 to fill trenches 310. The layer of polysilicon is etched back to planarize the structured to expose portions of layer 420, as illustrated in FIG. 4.

Figure 5:
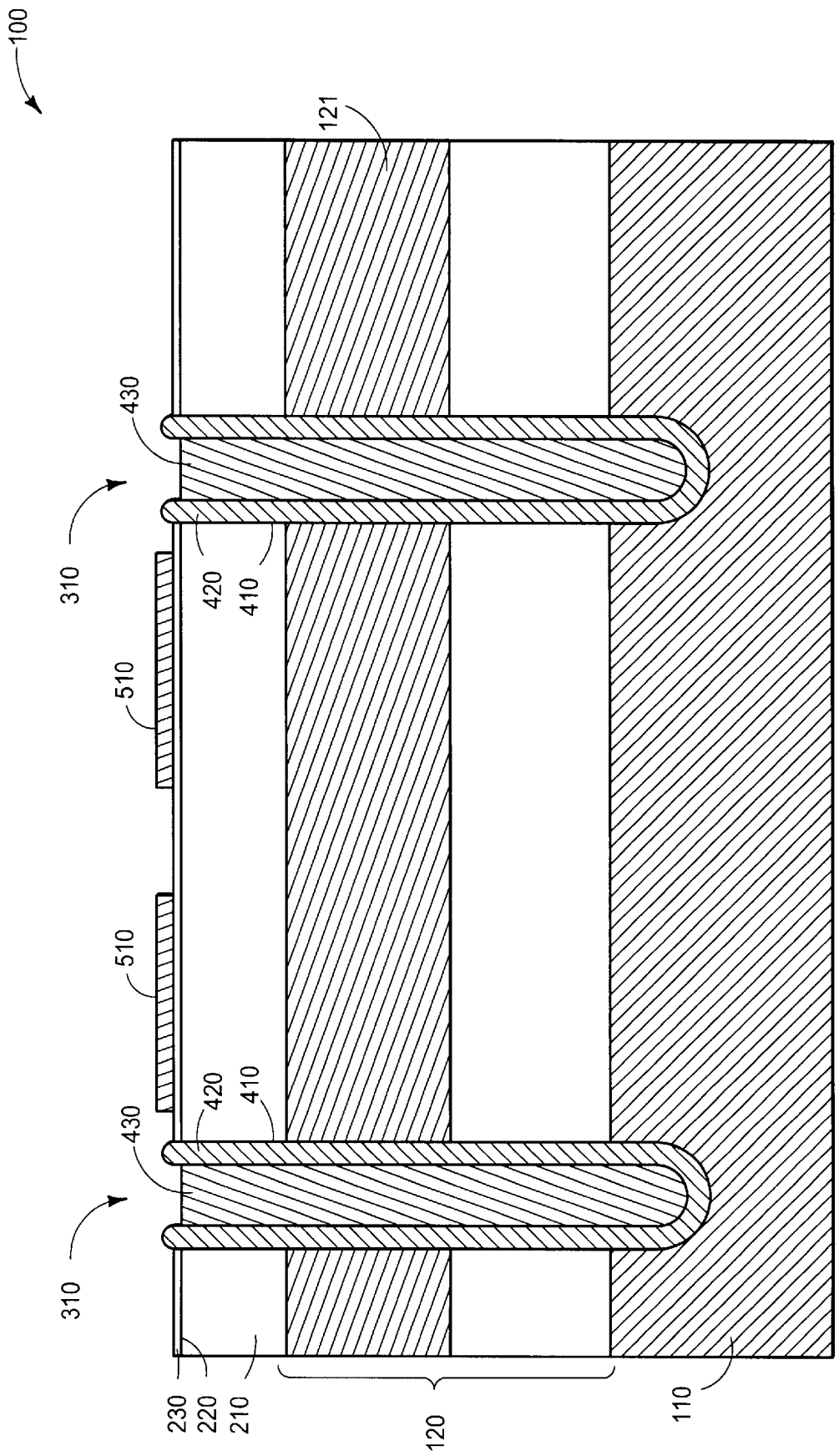

Turning to FIG. 5, portions of layer 420 located over layer 240 (FIG. 4) are removed preferably using a RIE process. Then, layer 240 (FIG. 4) is patterned into portions 510. In the preferred embodiment, layer 240 (FIG. 4) is patterned using an RIE process.

Figure 6:
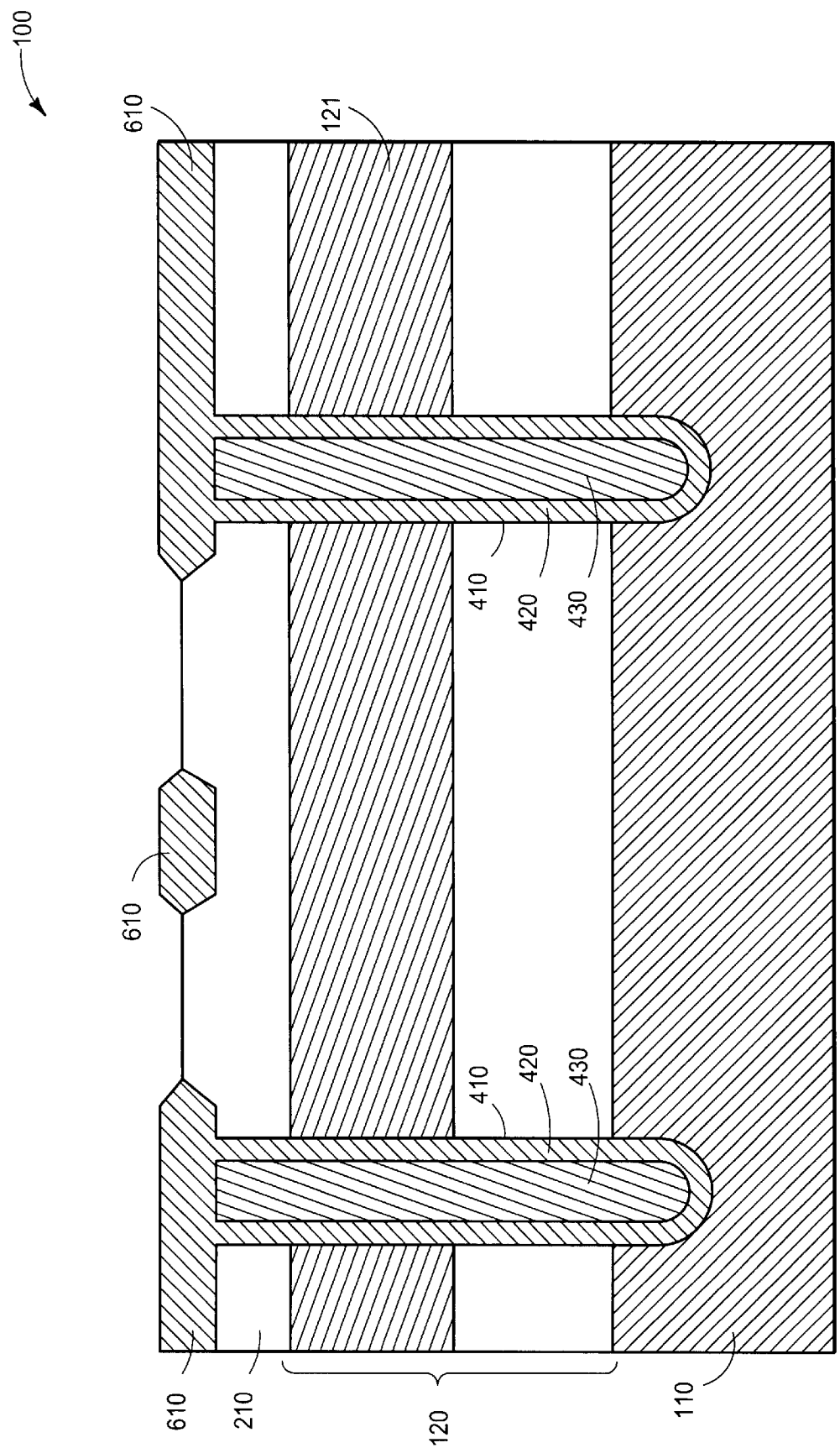

As illustrated in FIG. 6, field oxide regions 610 are formed over and in epitaxial layer 210. Portions 510 (FIG. 5) of electrically insulative layer 240 (FIG. 4) are used in a Polysilicon Encapsulated Local OXidation (PELOX) process to form regions 610. Next, portions 510 (FIG. 5) of electrically insulative layer 240 (FIG. 4) and the portions of layer 230 (FIG. 5) located underneath portions 510 (FIG. 5) are removed to expose portions of layer 210.

Figure 7:
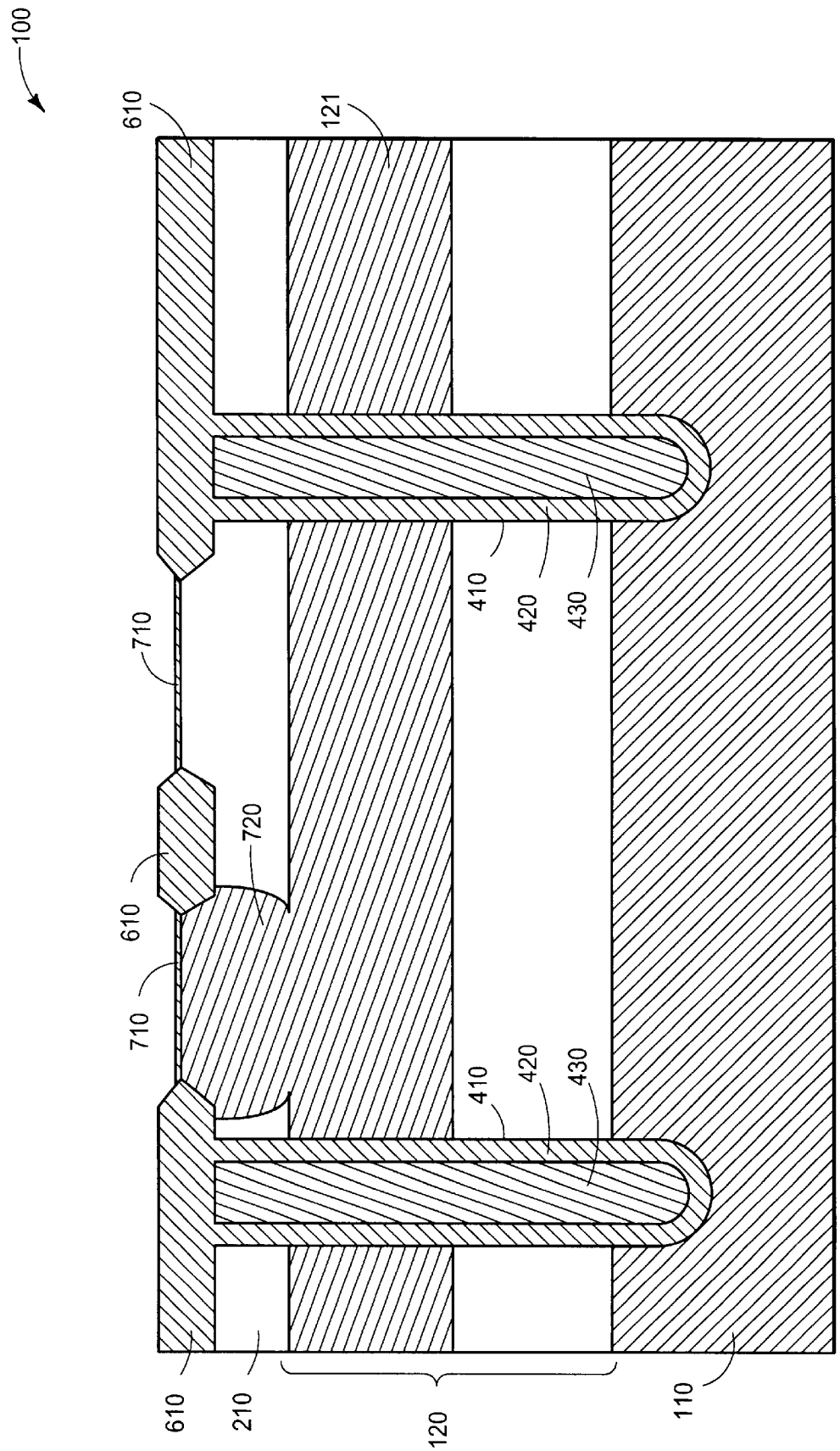

In FIG. 7, a pad oxide layer 710 is formed over epitaxial layer 210. As an example, layer 710 can be thermally grown on layer 210 to have a thickness of approximately 50 nanometers. Layer 710 serves as an implant screen during the subsequent self-aligned implant formation of a collector region 720 in layer 210. Region 720 has an N+ conductivity type and contacts layer 121. In the preferred embodiment, region 720 has the same doping concentration as layer 121.

Figure 8:
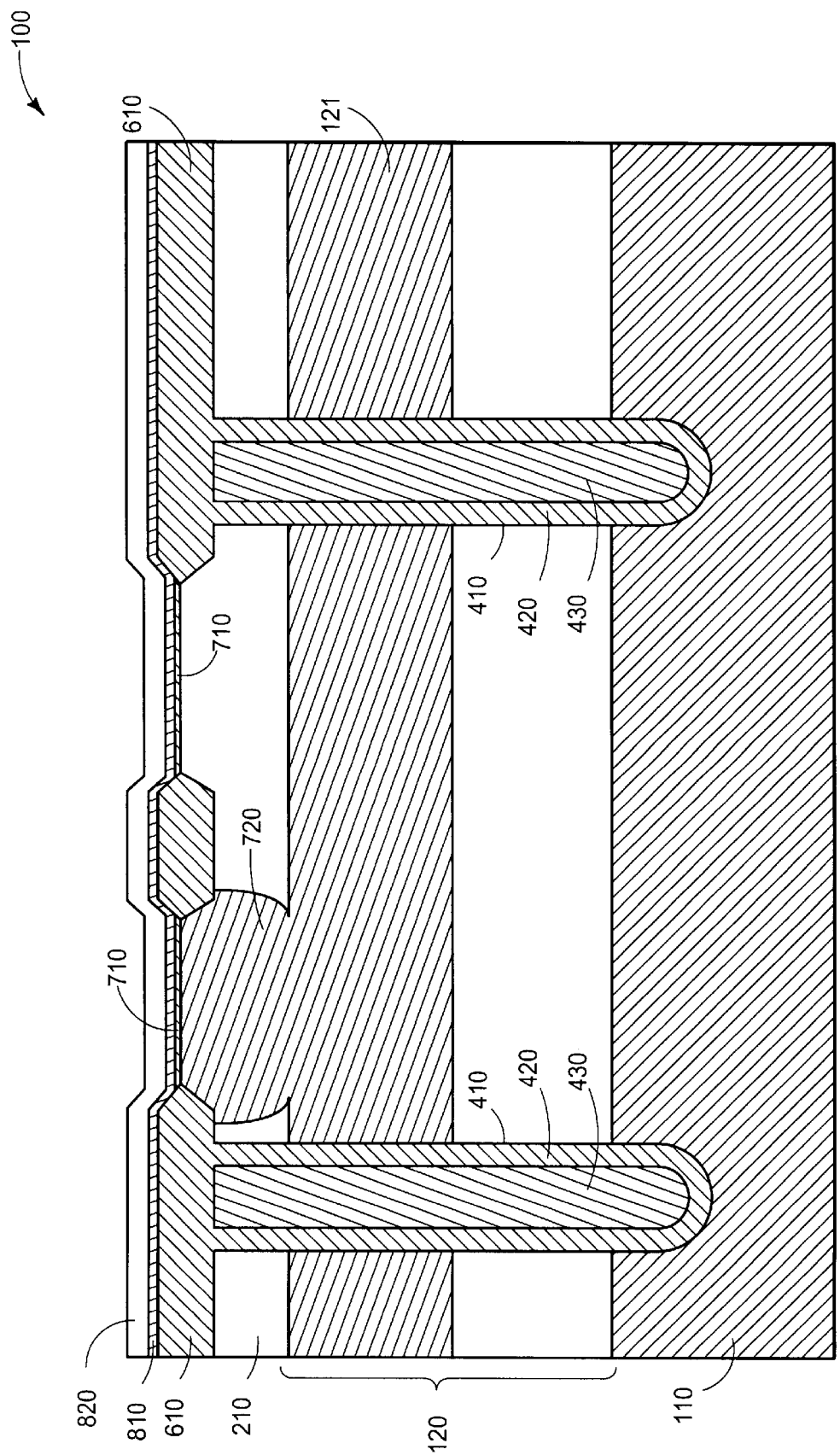
Figure 9:
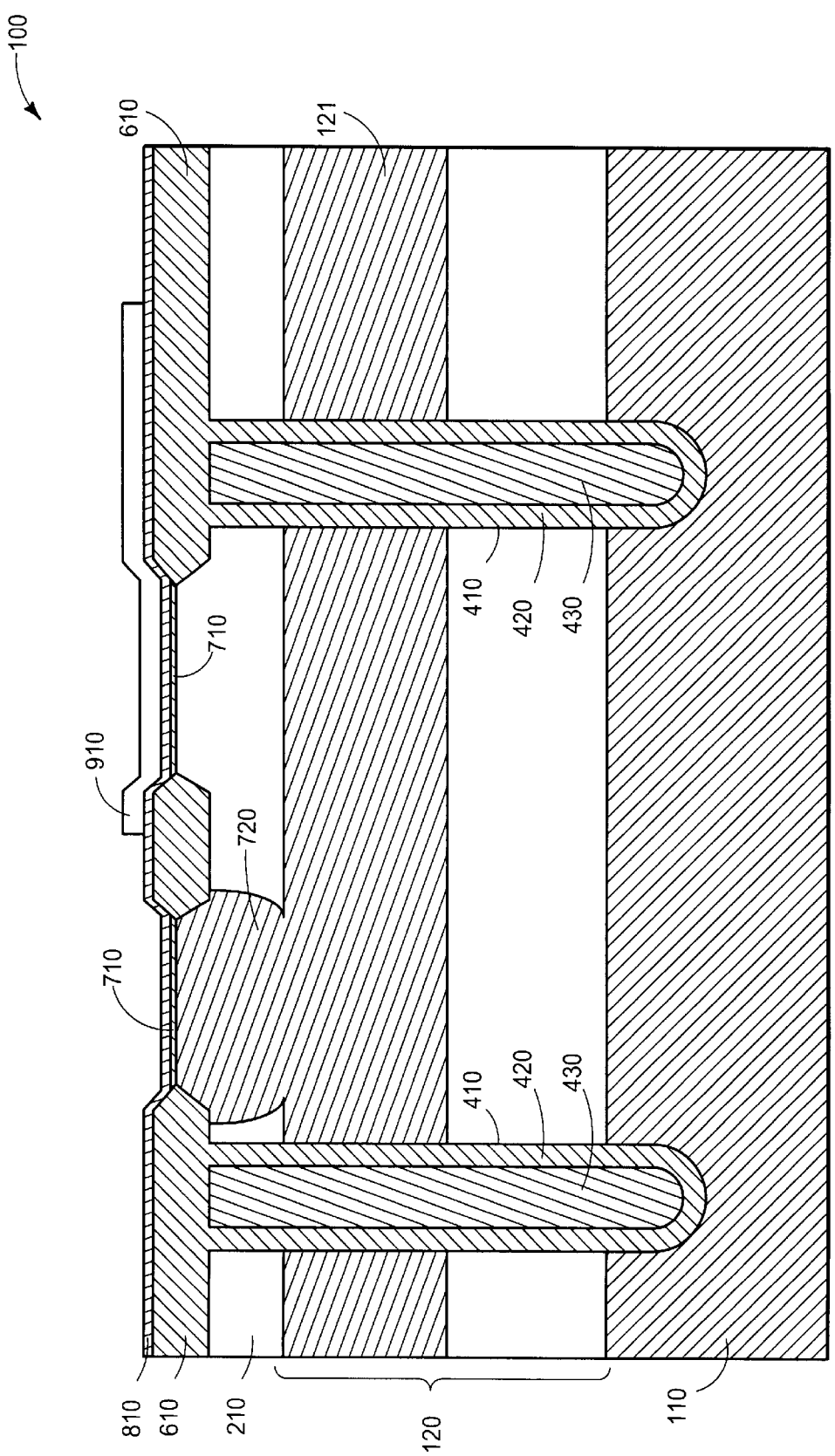

Turning to FIG. 8, layers 810 and 820 are formed sequentially over regions 610, layer 710, and substrate 110. In the preferred embodiment, layer 810 is an electrically insulative layer, and layer 820 is an electrically conductive layer. As an example, layer 810 can be comprised of silicon nitride and can have a thickness of approximately 100 nanometers. Also as an example, layer 820 can be comprised of polysilicon and can have a thickness of approximately 180 nanometers. Layer 820 is located over layer 810 and is preferably located on or contacts layer 810. A portion of layer 820 is doped with a P-type dopant and will serve as an extrinsic lead to a base region for the HBT. As illustrated in FIG. 9, layer 820 (FIG. 8) is patterned to leave a portion 910. Portion 910 is the doped portion of layer 820.

Figure 10:
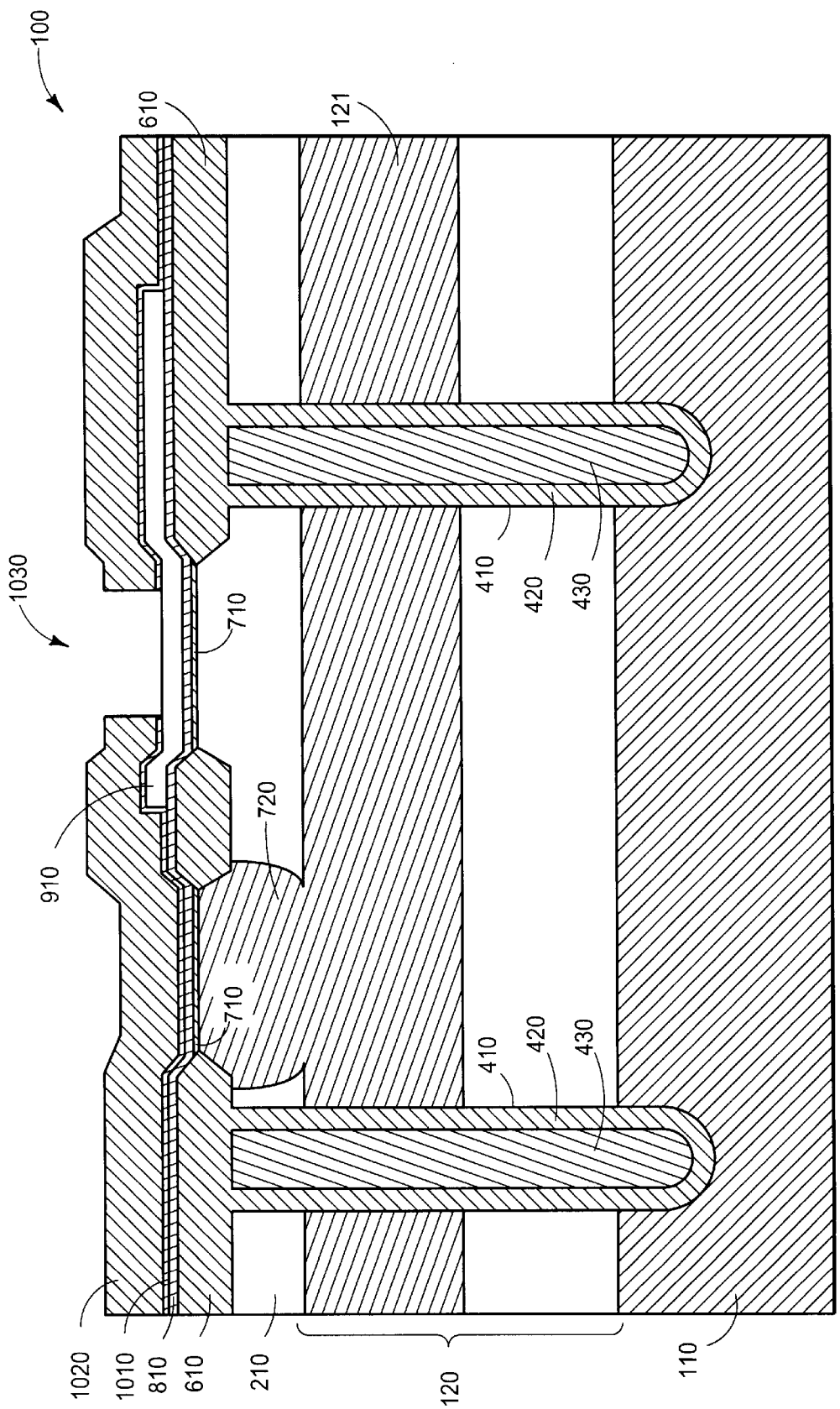

As illustrated in FIG. 10, electrically insulative layers 1010 and 1020 are deposited sequentially over portion 910, layer 810, regions 610, layer 710, and substrate 110. In the preferred embodiment, layer 1010 is comprised of silicon nitride and has a thickness of approximately 50 nanometers. Also in the preferred embodiment, layer 1020 is comprised of TEOS and has a thickness of approximately 1,000 nanometers. Layer 1020 can be planarized, if desired, and then, layer 1020 is patterned to defined a hole 1030 within layer 1020. Hole 1030 is also formed or extended into layer 1010. The etching of hole 1030 defines an opening for the subsequent formation of both a base region and an emitter region for the HBT. In the preferred embodiment, hole 1030 has side walls that are substantially parallel to each other. In the preferred embodiment, hole 1030 exposes a portion of portion 910 of the electrically conductive layer.

Figure 11:
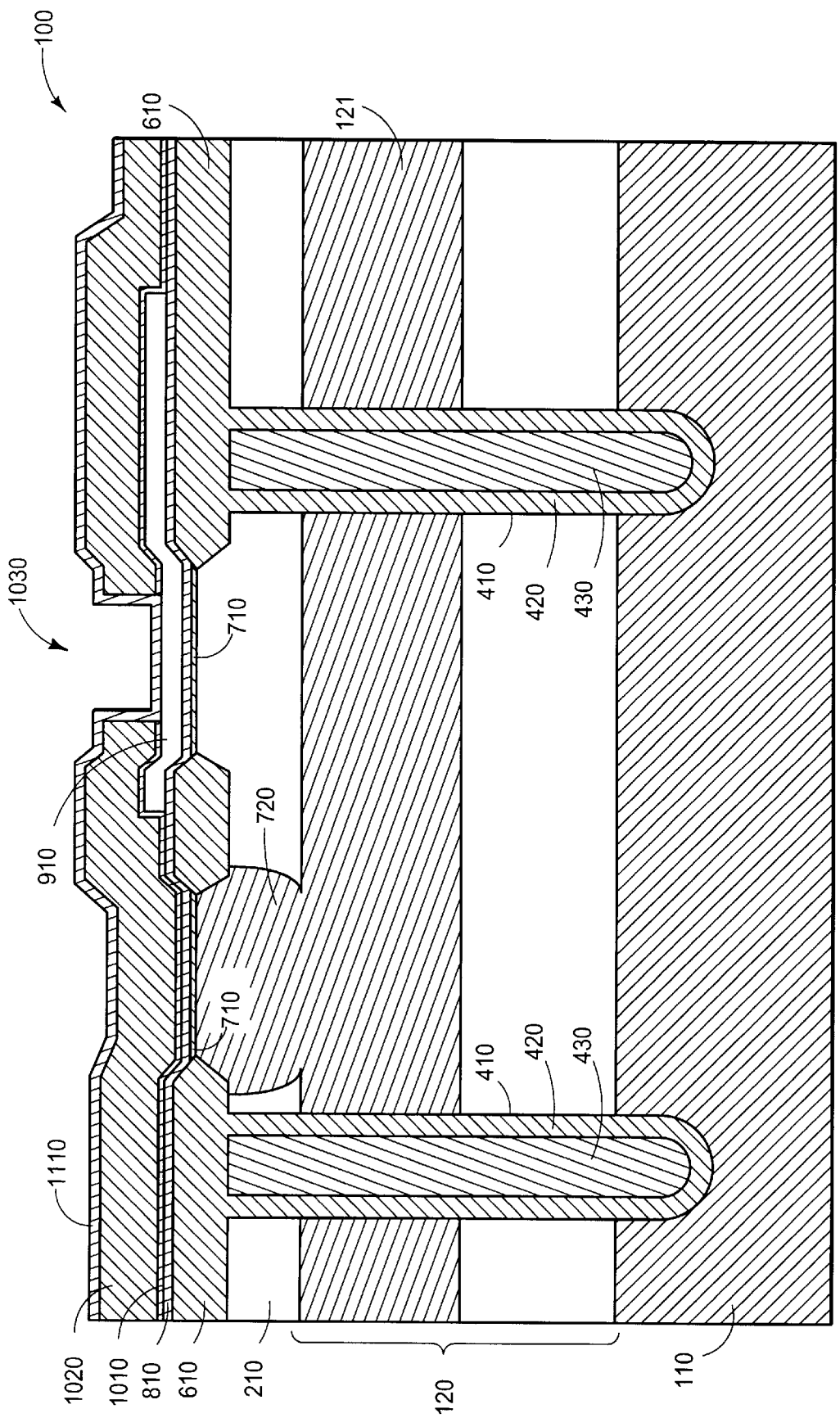
Figure 12:
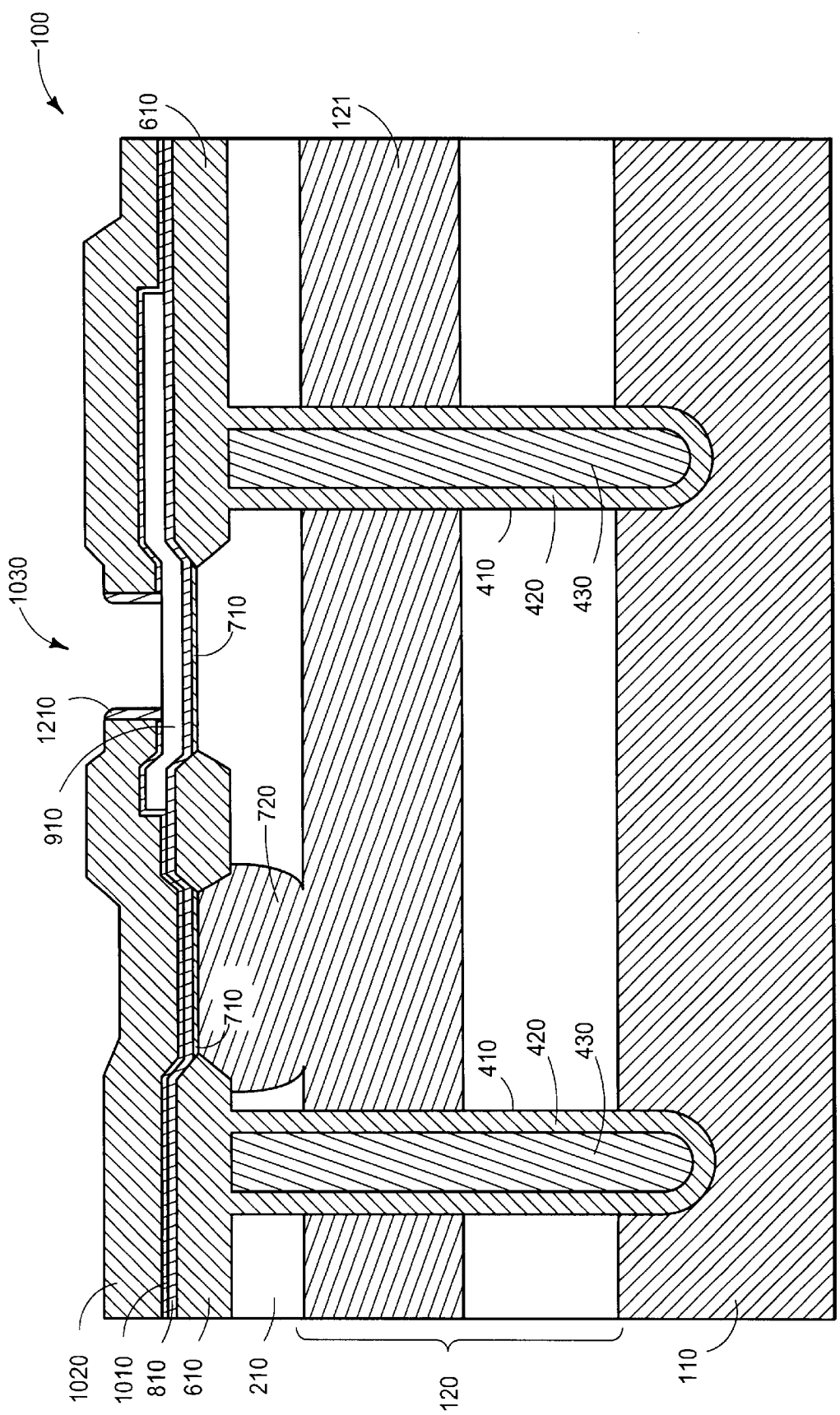

FIG. 11 illustrates the formation of an electrically insulative layer 1110 over layer 1020 and in hole 1030. In the preferred embodiment, layer 1110 is comprised of silicon nitride and has a thickness of approximately 100 nanometers. In FIG. 12, layer 1110 (FIG. 11) is anisotropically etched to leave spacers or portions 1210 in hole 1030. Portions 1210 are located along the side walls of hole 1030 and are also located over portion 910 of the electrically insulative layer. In the preferred embodiment, the spacers or portions 1210 physically contact the side walls of hole 1030 and also physically contact portion 910.

Figure 13:
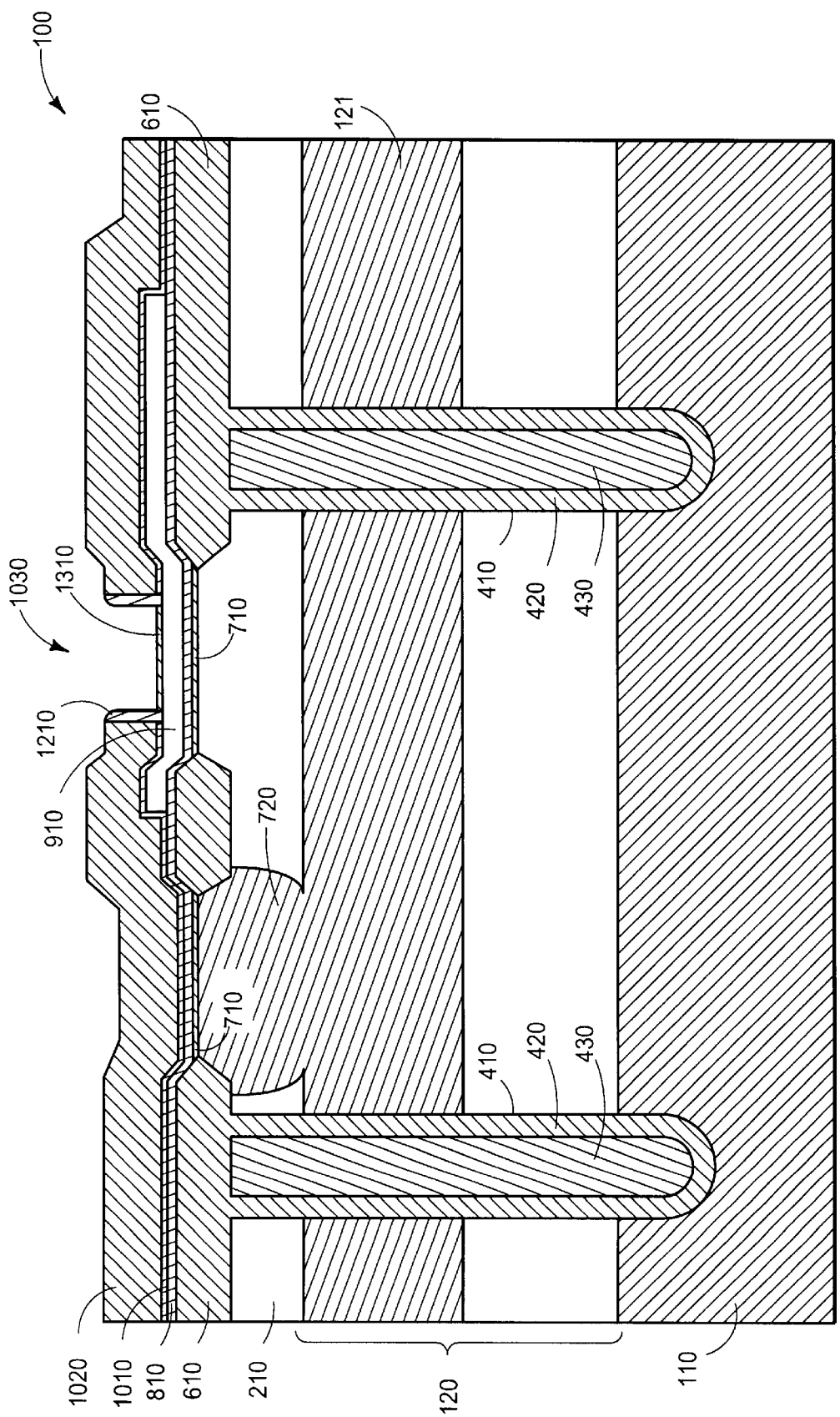
Figure 14:
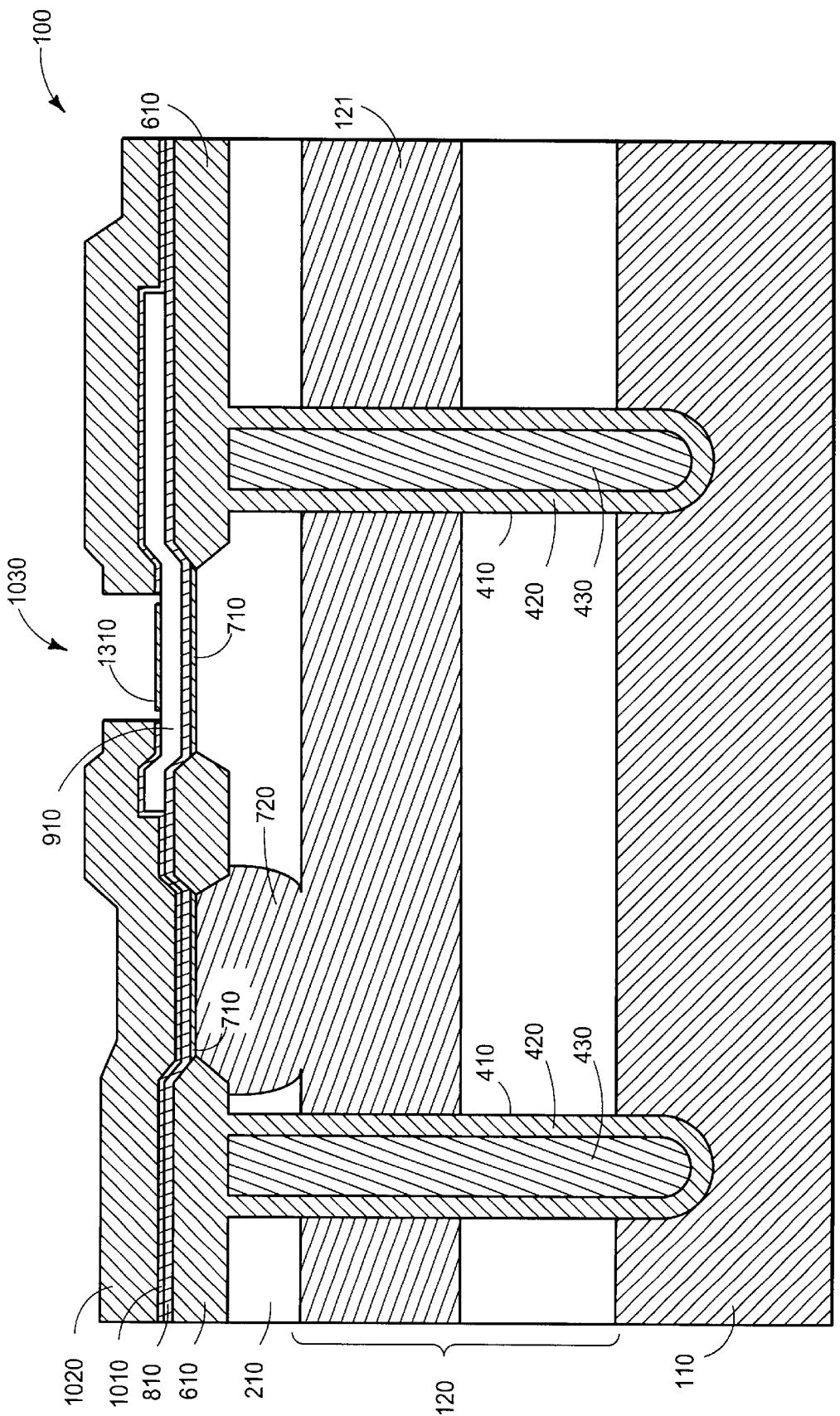

Turning to FIG. 13, an electrically insulative layer 1310 is formed over portion 910 of the electrically conductive layer and adjacent to the spacers or portions 1210. In the preferred embodiment, layer 1310 is comprised of silicon dioxide and is grown on portion 910 using a thermal oxidation process. As illustrated in FIG. 14, the spacers or portions 1210 (FIG. 13) are removed after the formation of layer 1310. The removal of the spacers exposes portions of portion 910 of the electrically conductive layer.

Figure 15:
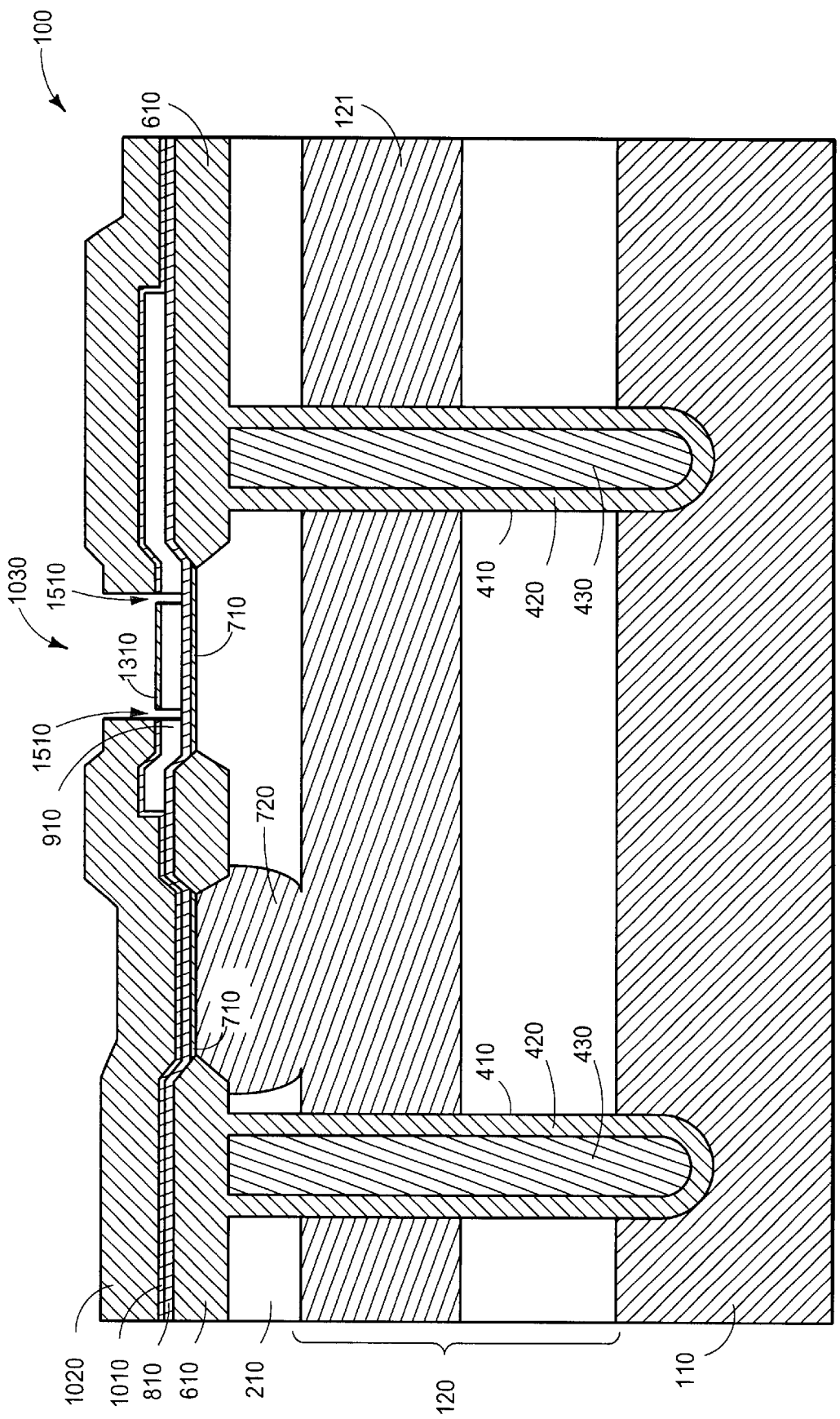
Figure 16:
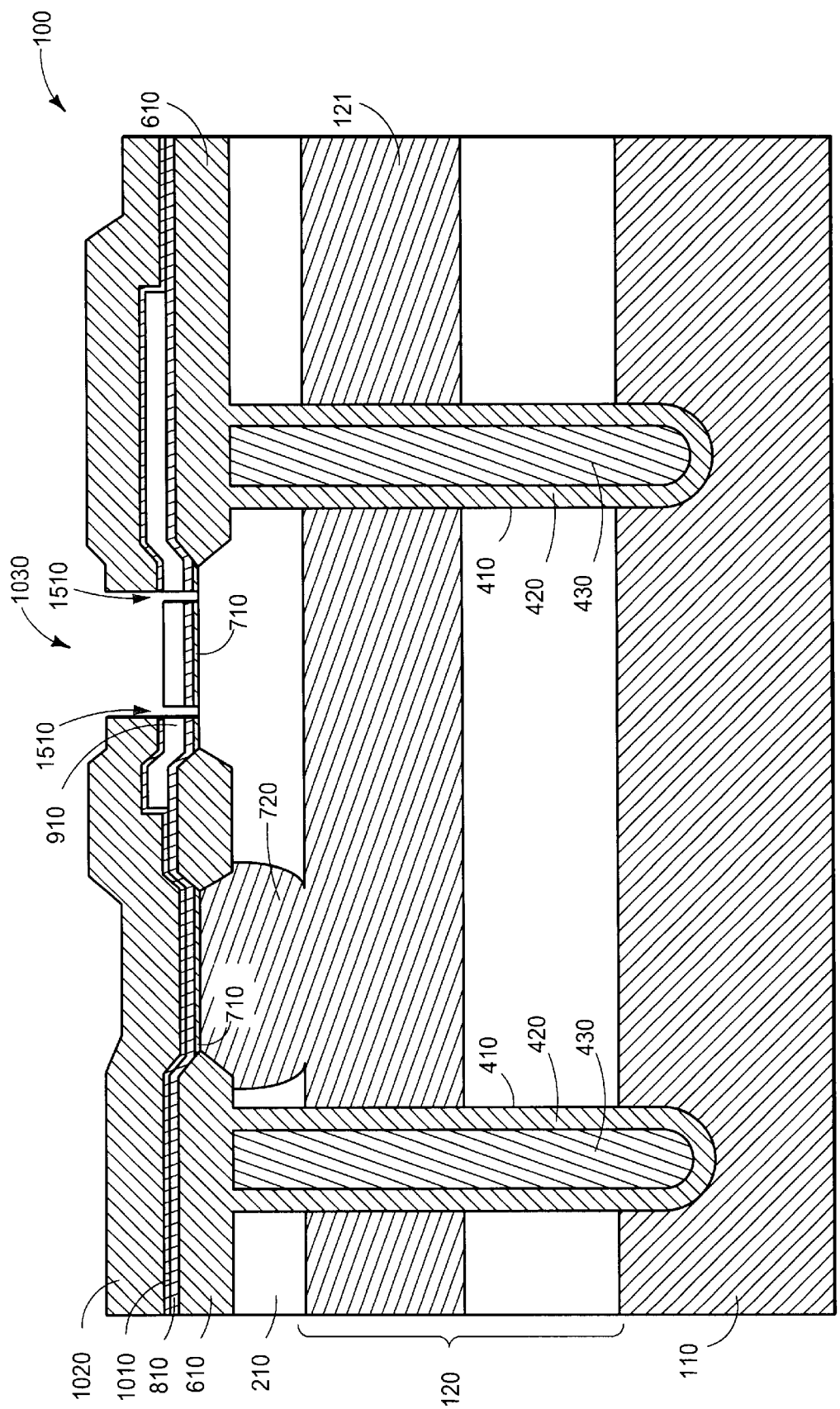

As illustrated in FIG. 15, layers 1310 and 1020 are used as self-aligned etch masks to pattern holes 1510 into portion 910 of the electrically conductive layer. Holes 1510 are preferably only etched into a portion of portion 910. In FIG. 16, holes 1510 are etched or extended into portions of layers 810 and 710. During the etching of layer 710, layer 1310 (FIG. 15) and a top portion of layer 1020 are also removed. As illustrated in FIG. 16, holes 1510 are formed within hole 1030 and expose portions of epitaxial layer 210.

Figure 17:
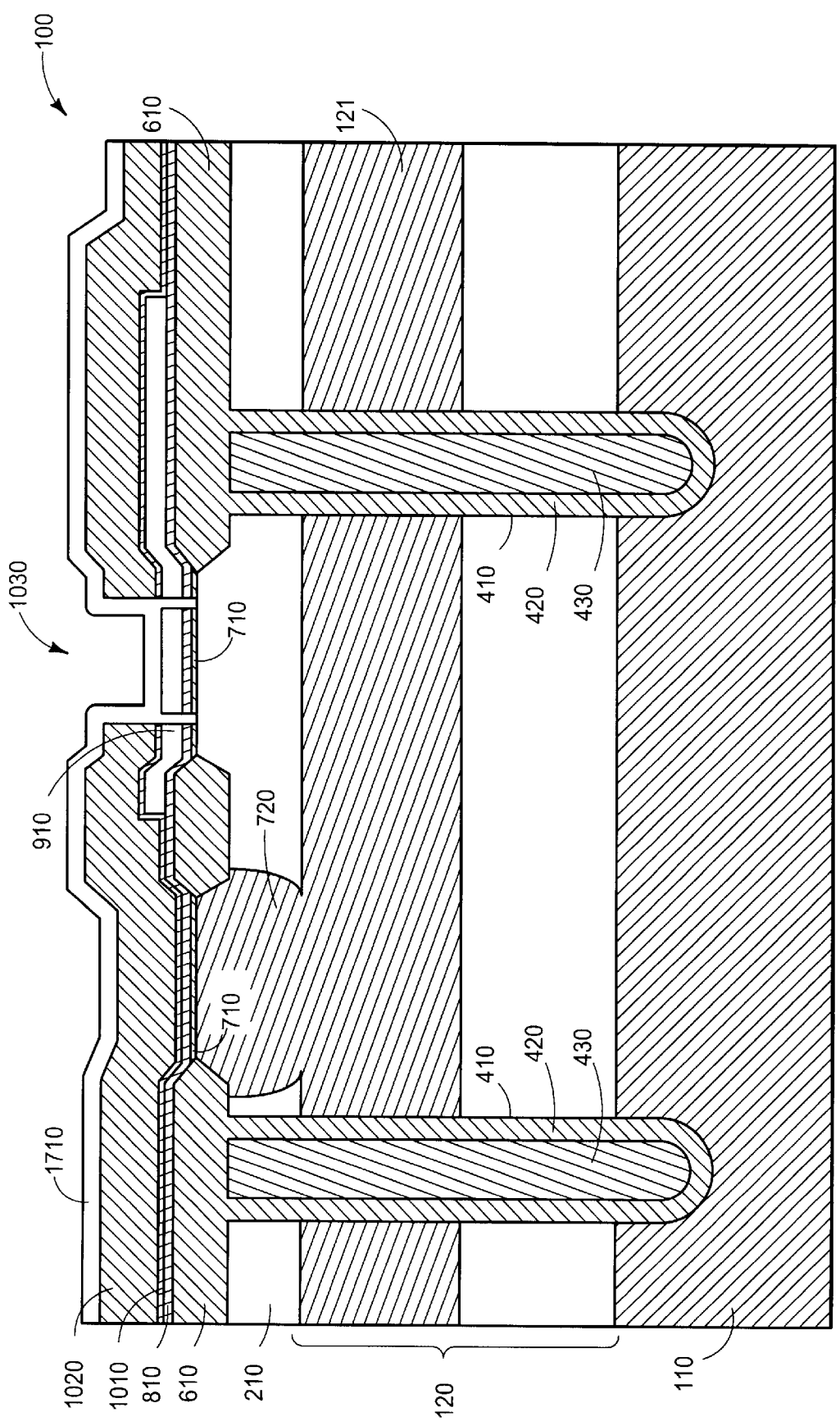

FIG. 17 illustrates a layer 1710 deposited over layer 1020 and in holes 1030 and 1510 (FIG. 16). In the preferred embodiment, layer 1710 is located on or contacts layer 1020 and epitaxial layer 210. Also in the preferred embodiment, layer 1710 is an electrically conductive layer comprised of doped polysilicon. As an example, layer 1710 can have a thickness of approximately 150 nanometers.

Figure 18:
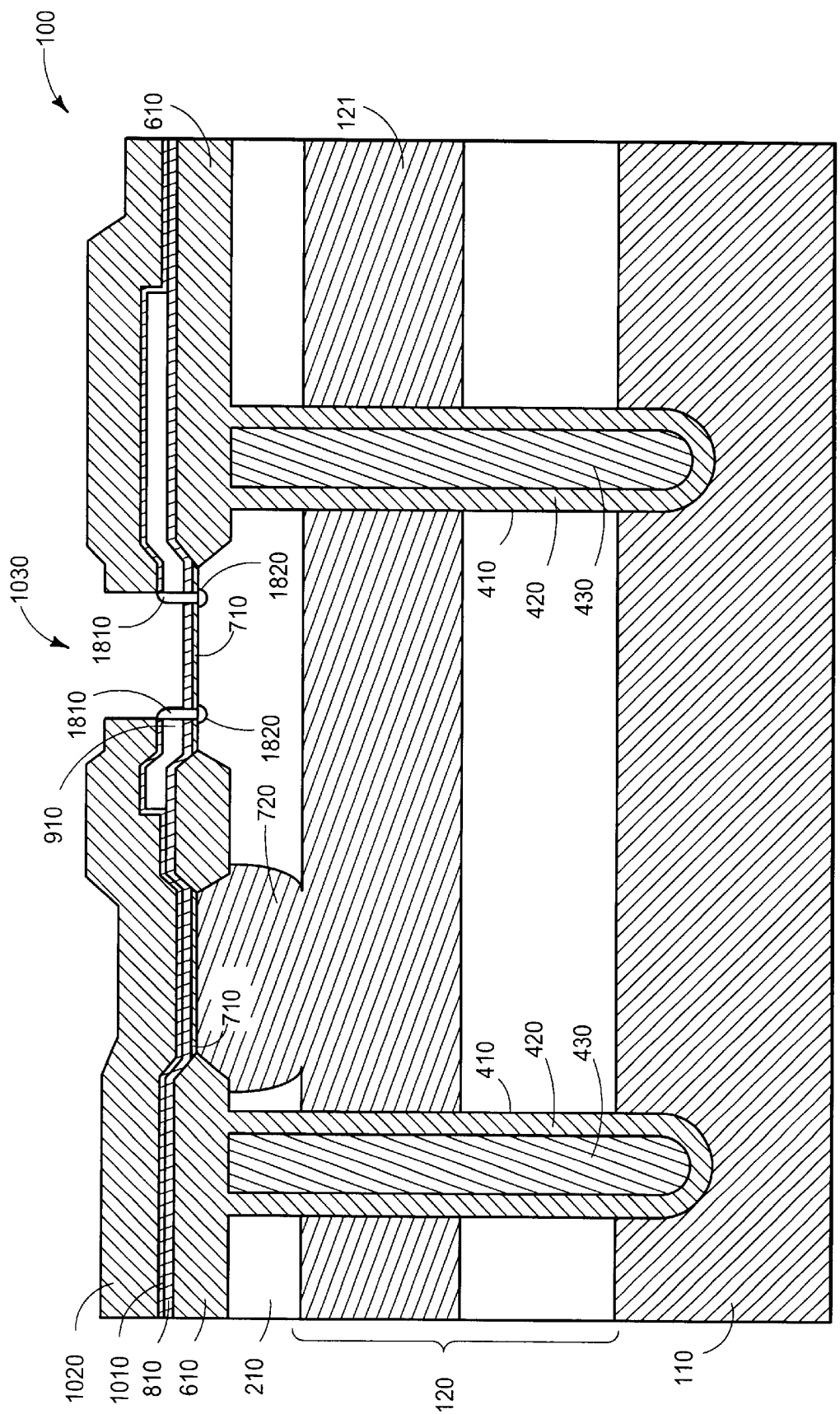

Next, in FIG. 18, layer 1710 (FIG. 17) is anisotropically etched to leave spacers or portions 1810 within hole 1030. In the preferred embodiment, portions 1810 physically contact and are electrically coupled to portion 910 of the electrically conductive layer. Also in the preferred embodiment, portions 1810 contact portions of epitaxial layer 210. The formation of portions 1810 also removes a portion of portion 910 located between portions 1810. Doped regions 1820 are diffused from portions 1810 into epitaxial layer 210. The dopant forming regions 1820 can originate from portion 910 of the electrically conductive layer and from portions 1810.

Figure 19:
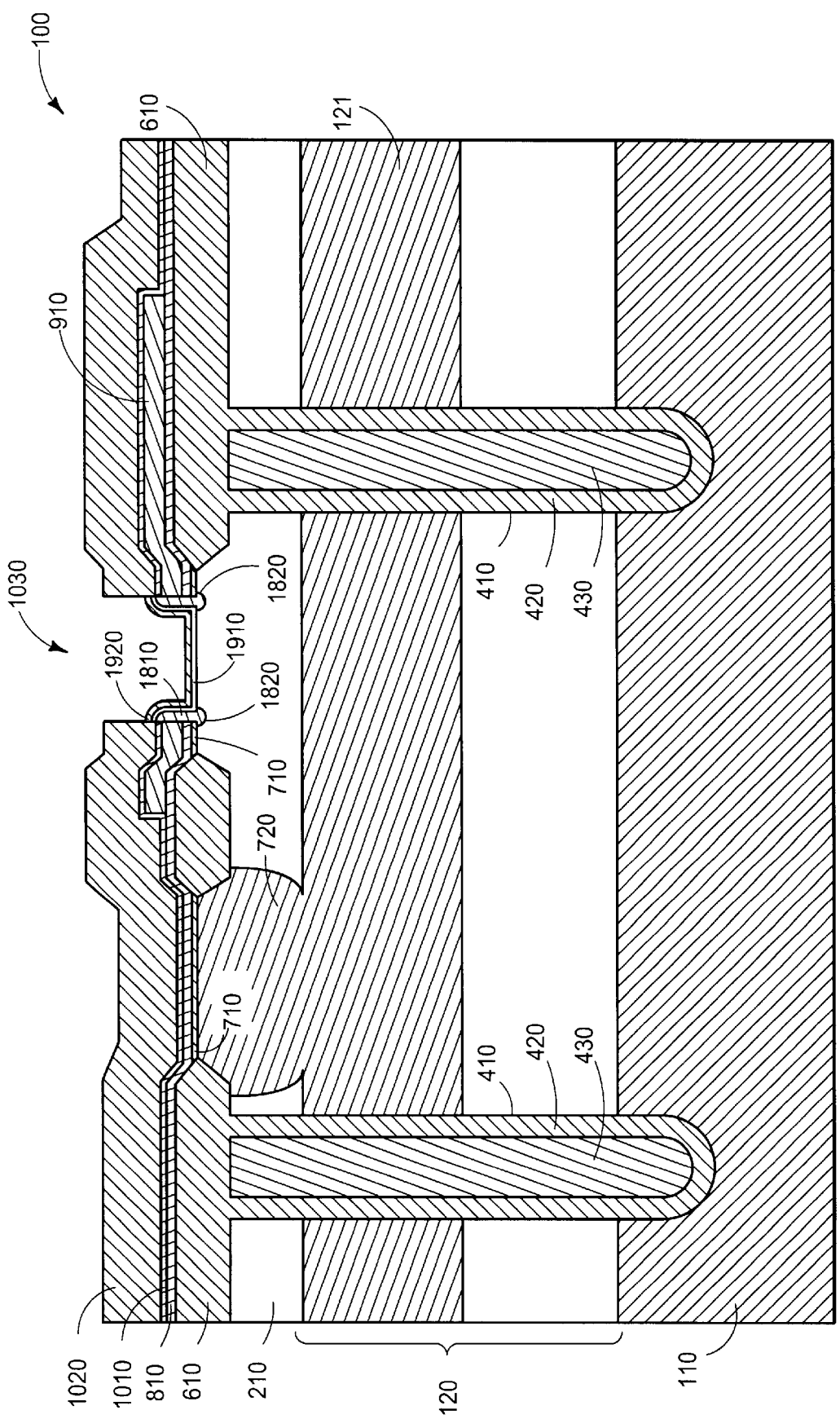

As illustrated in FIG. 19, a portion of layers 810 and 710 located between portions 1810 are also etched or removed to expose a portion of epitaxial layer 210. Next, a layer 1910 is formed over the exposed portion of epitaxial layer 210 and over portions 1810. In the preferred embodiment, layer 1910 is comprised of silicon germanium or silicon germanium carbon and has a thickness of approximately 50 nanometers. Also in the preferred embodiment, layer 1910 is epitaxially grown on the exposed portion of epitaxial layer 210 and on portions 1810. Therefore, layer 1910 preferably physically contacts portions 1810 and epitaxial layer 210. At least a portion of layer 1910 forms a base region for the HBT. A heterojunction exists at the interface between layer 1910 and epitaxial layer 210.

Next, a layer 1920 is formed over layer 1910. In the preferred embodiment, layer 1920 is an electrically insulative layer. As an example, layer 1920 can be comprised of silicon dioxide and can have a thickness of approximately 15 nanometers. Layers 1910 and 1920 are located within hole 1030.

Figure 20:
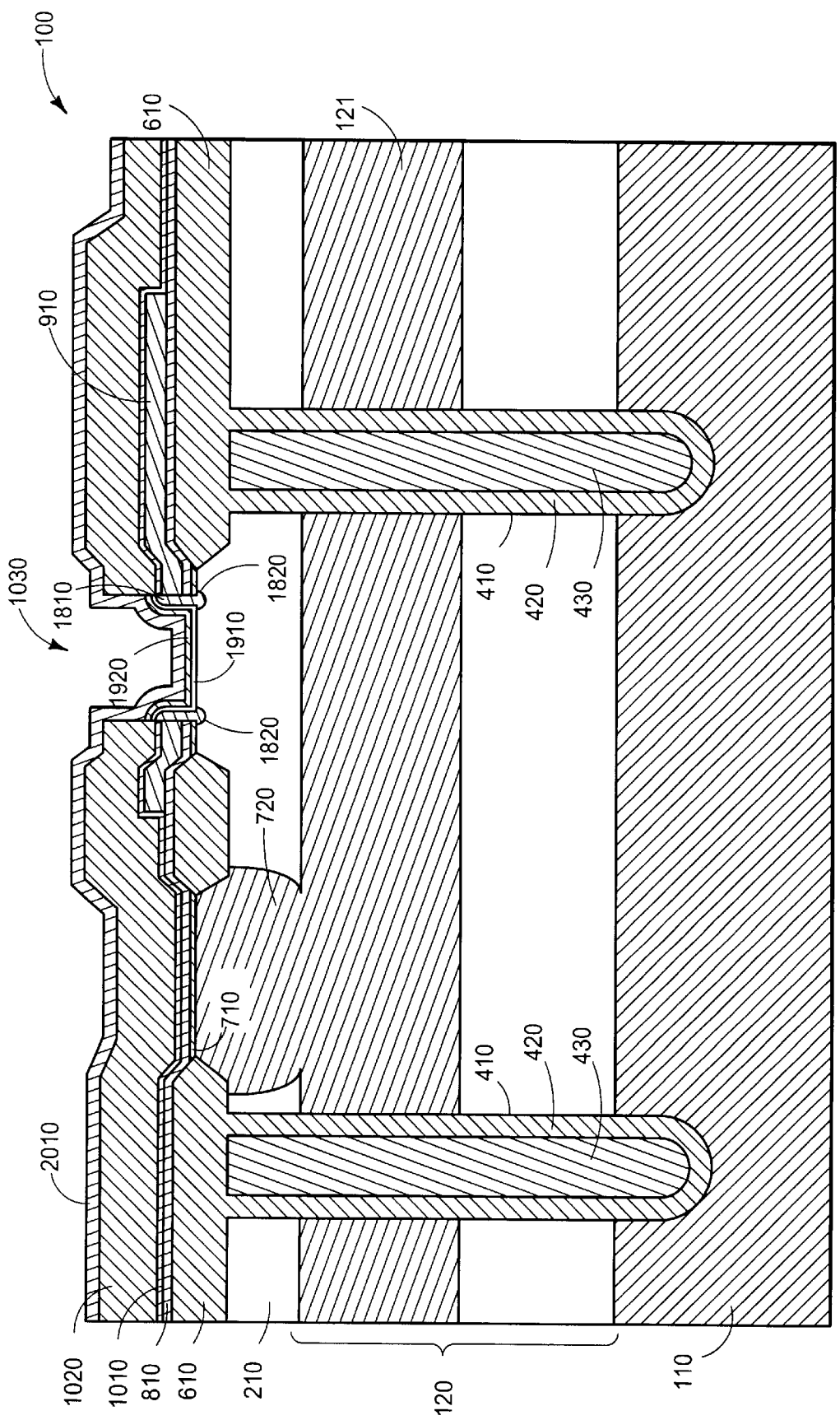
Figure 21:
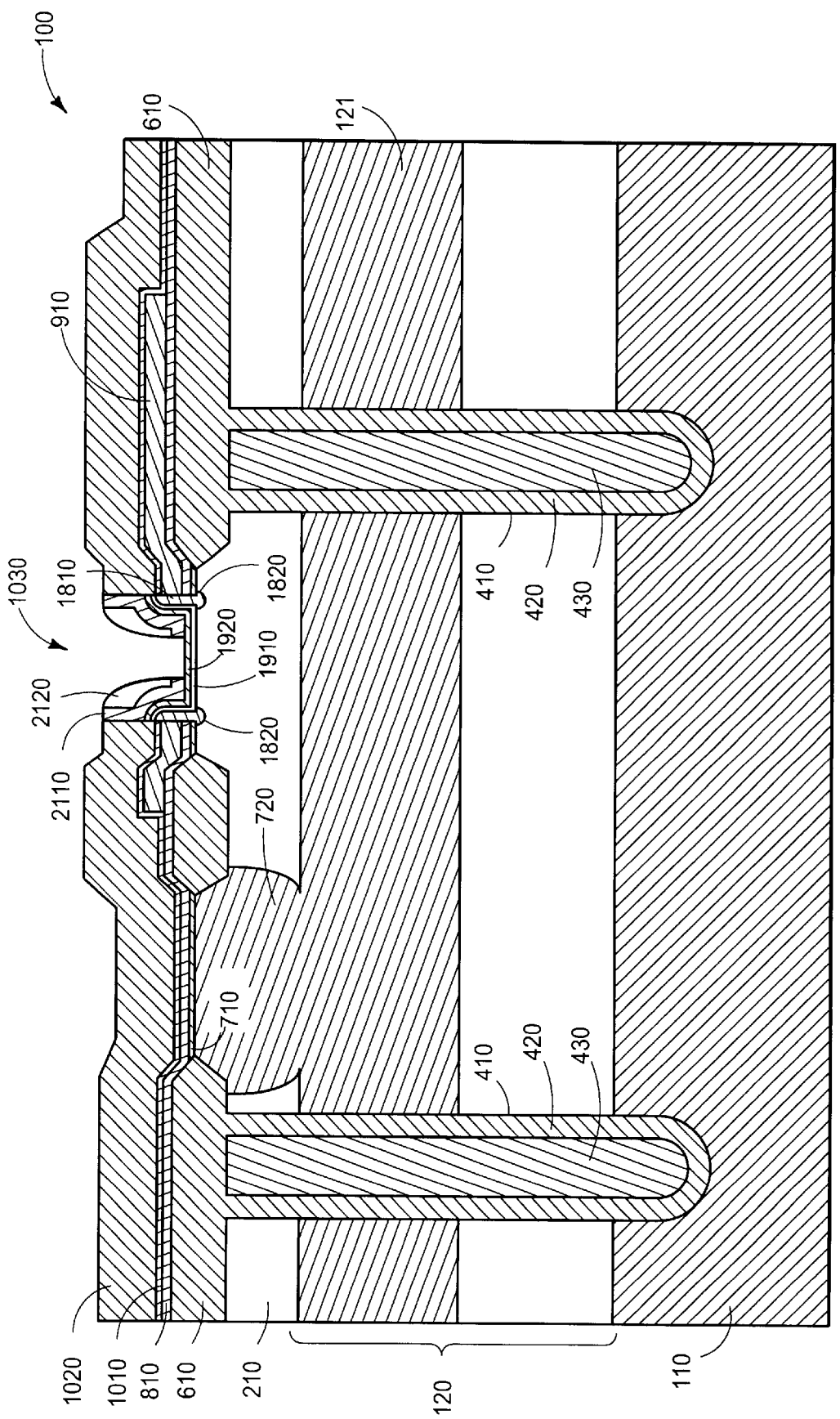

Turning to FIG. 20, a layer 2010 is formed over layer 1020 and in hole 1030 over layer 1920. In the preferred embodiment, layer 2010 is an electrically insulative layer. As an example, layer 2010 can be comprised of silicon nitride and can have a thickness of approximately 100 nanometers. Next, in FIG. 21, a polysilicon layer is formed over layer 2010 (FIG. 20) and in hole 1030. The polysilicon layer and layer 2010 (FIG. 20) are anisotropically etched to form spacers or portions 2120 and 2110, respectively, in hole 1030. Spacers or portions 2110 and 2120 are located adjacent to he side walls of hole 1030. The formation of portions 2110 and 2120 expose a portion of layer 1920.

Figure 22:
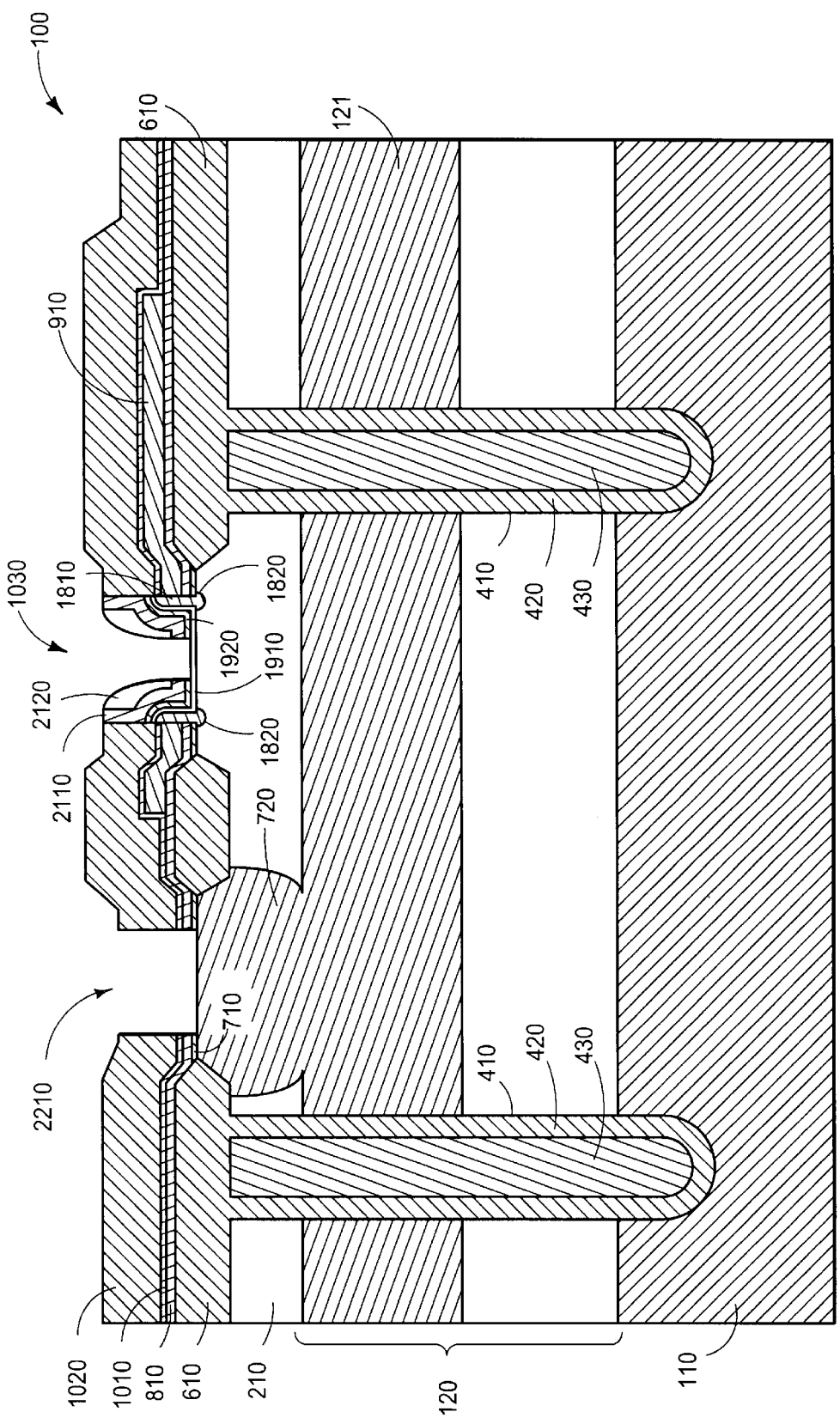

As illustrated in FIG. 22, a hole 2210 is formed in layers 1020, 1010, 810, and 710. Hole 2210 forms a collector opening. The formation of hole 2210 within layer 710 also removes the exposed portion of layer 1920 in hole 1030. Accordingly, after the formation of hole 2210, a portion of layer 1910 is exposed within hole 1030.

Figure 23:
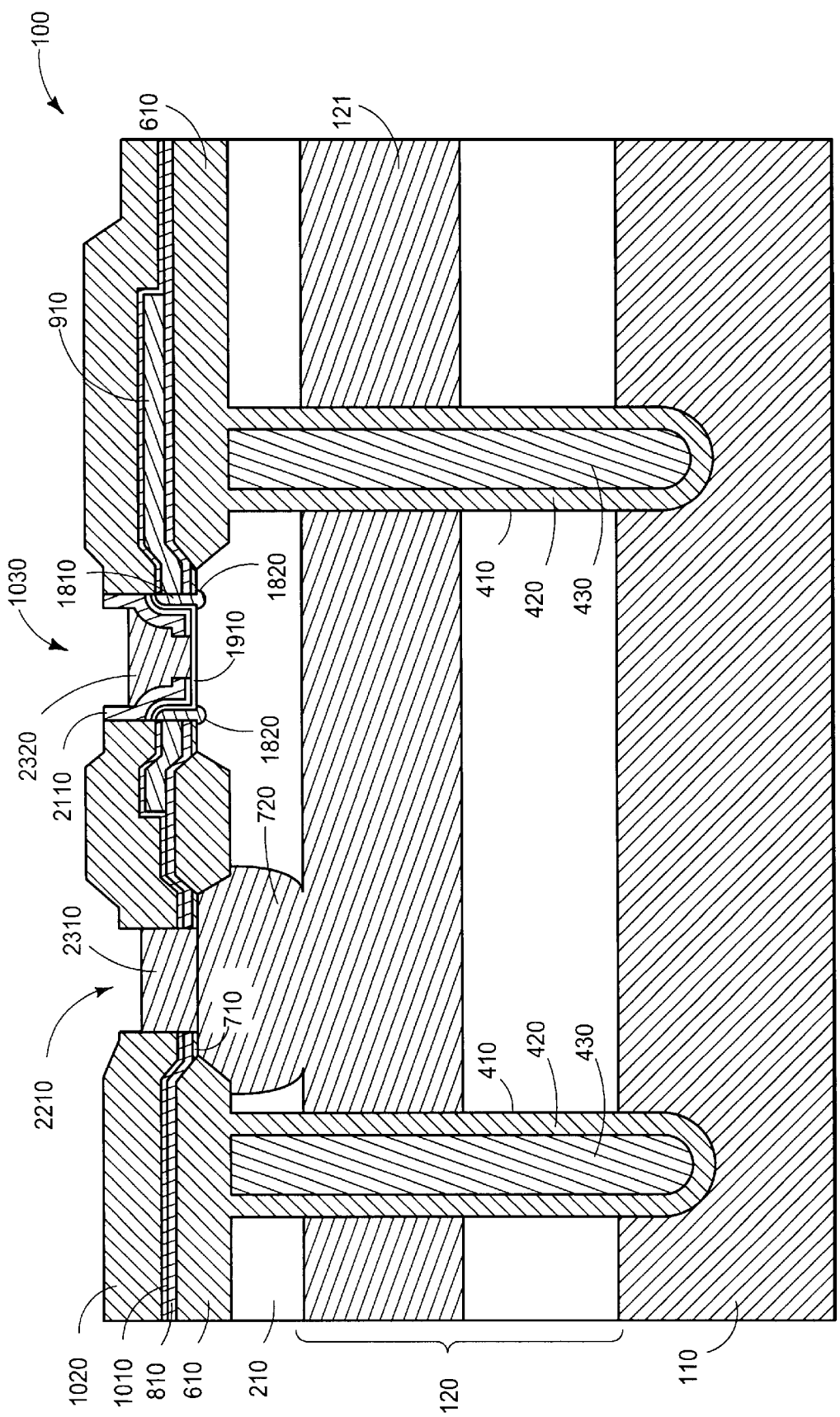

Next, in FIG. 23, a doped polysilicon layer is deposited over layer 1020 and in holes 2210 and 1030 to a thickness of approximately 800 nanometers. The doped polysilicon layer is etched back or planarized to leave portion 2310 within hole 2210 and to leave portion 2320 within hole 1030. Portion 2310 forms a portion of the collector region for the HBT, and portion 2320 forms the emitter region for the HBT. In the preferred embodiment, portions 2310 and 2320 are formed simultaneously with each other. Portions 2310 and 2320 are implanted with a high concentration of an N-type dopant, and then, portions 2310 and 2320 are annealed. In the preferred embodiment, the doping concentration of portion 2310 is the same as that for region 720 and layer 121. Also in the preferred embodiment, portion 2310 physically contacts and is coupled to region 720. A heterojunction exists at the interface between layer 1910 and portion 2320.

Figure 24:
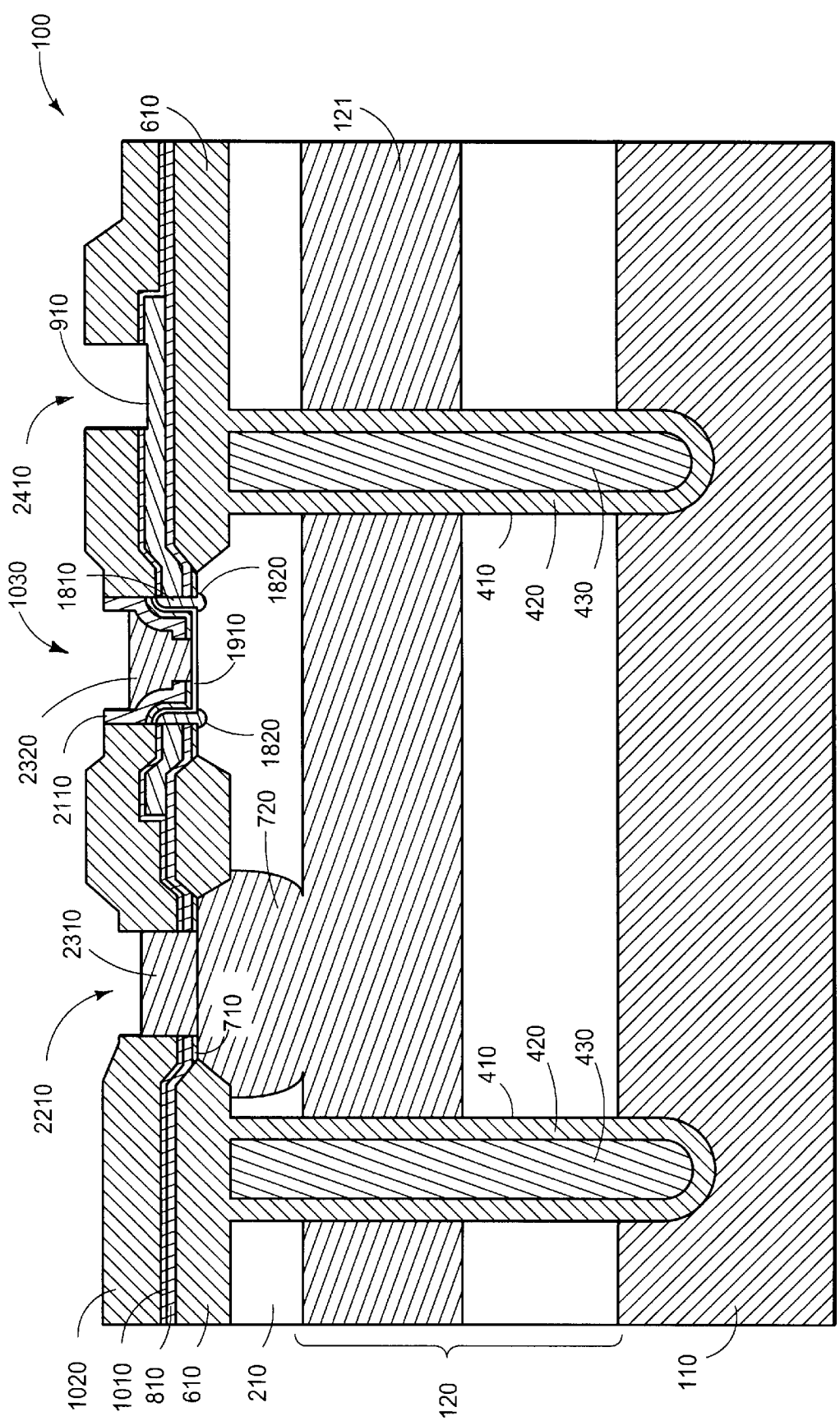
Figure 25:
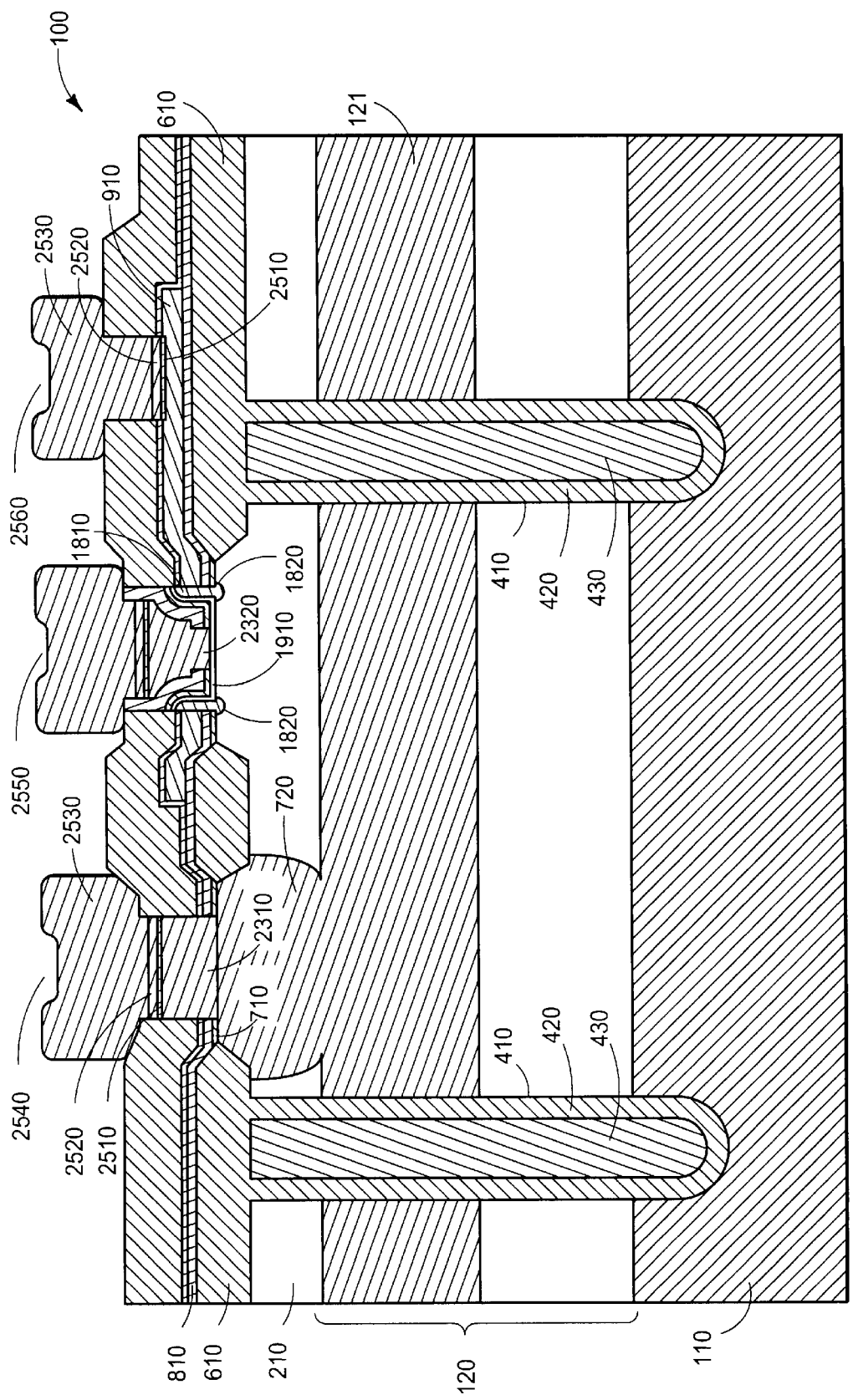

In FIG. 24, a hole 2410 is formed within layers 1020 and 1010 to expose a portion of portion 910 of the electrically conductive layer. Hole 2410 is used to provide an electrical contact to the base region of the HBT. Turning to FIG. 25, a base contact 2560 is formed within hole 2410 (FIG. 24) over portion 910 of the electrically conductive layer. Base contact 2560 is electrically coupled to the base region of the HBT via portion 910 of the electrically conductive layer and portions 1810. Also illustrated in FIG. 25, an emitter contact 2550 is formed over portion 2320 and is electrically coupled to the emitter region of the HBT. Emitter contact 2550 is located directly over layer 1910, which forms the base region of the HBT. Furthermore, a collector contact 2540 is formed over portion 2310 of the collector region for the HBT. Collector contact 2540 is electrically coupled to the collector region of the HBT. In the preferred embodiment, contacts 2540, 2550, and 2560 are formed simultaneously with each other. In the preferred embodiment, contacts 2540, 2550, and 2560 are comprised of a platinum suicide layer 2510, a titanium tungsten layer 2520, and an aluminum copper layer 2530. As an example, layers 2510, 2520, and 2530 can have thicknesses of approximately 18, 150, and 650 nanometers, respectively.

Figure 26:
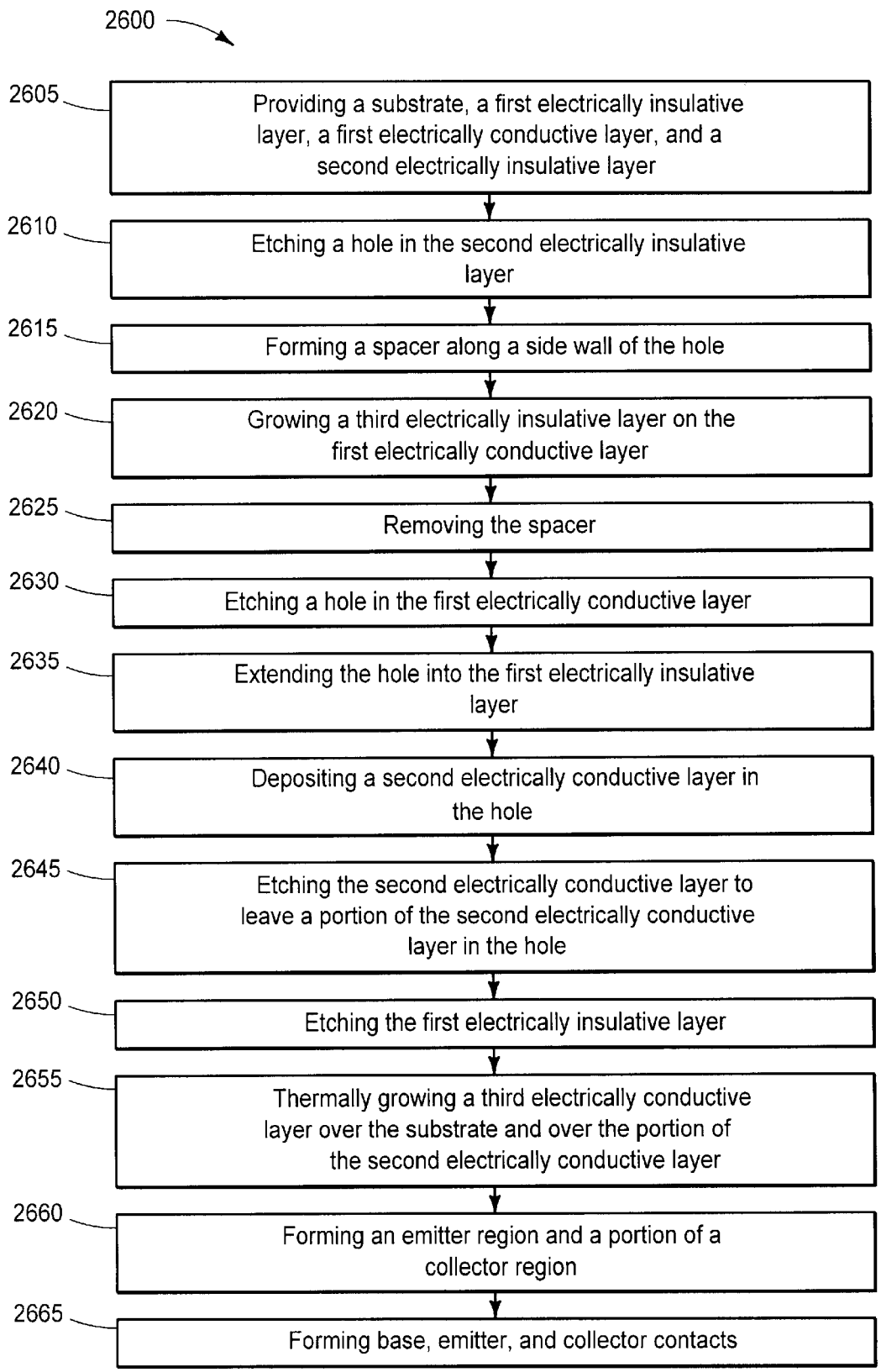
FIG. 26 illustrates a flow chart of the method of manufacturing the semiconductor component of FIGS. 1 through 25 in accordance with an embodiment of the invention.

FIG. 26 illustrates a flow chart 2600 of the method of manufacturing semiconductor component 100 described previously with respect to FIGS. 1 through 25. At a step 2605, a substrate, a first electrically insulative layer, a first electrically conductive layer, and a second electrically insulative layer are provided. In particular, the first electrically insulative layer is preferably located over the substrate; the first electrically conductive layer is preferably located on the first electrically insulative layer; and the second electrically insulative layer is preferably located over the first electrically conductive layer. At a step 2610, a hole is etched in the second electrically insulative layer. At a step 2615, a spacer is formed along the side wall of the hole. The spacer is also preferably located over a portion of the first electrically conductive layer and over a portion of the first electrically insulative layer. Next, at a step 2620, a third electrically insulative layer is grown on the first electrically conductive layer. The third electrically insulative layer is also preferably located adjacent to the spacer. Then, at a step 2625, the spacer is removed after forming the third electrically insulative layer.

At a step 2630, a hole is etched in the first electrically conductive layer. In particular, the hole is preferably etched into the portion of the first electrically conductive layer over which the spacer was located. The third electrically insulative layer is preferably used as an etch mask while etching the first electrically conductive layer during step 2630. Next, at a step 2635, the hole of step 2630 is extending into the first electrically insulative layer. In particular, the hole is preferably extended into the portion of the first electrically insulative layer over which the spacer was located. The third electrically insulative layer is preferably removed while etching the first electrically insulative layer.

Then, at a step 2640, a second electrically conductive layer is deposited in the hole. The second electrically conductive layer is also preferably located over the first electrically conductive layer, over the second electrically insulative layer, and on the substrate. Subsequently, at a step 2645, the first and second electrically conductive layers are etched to leave a portion of the second electrically conductive layer in the hole. The portion of the second electrically conductive layer also preferably contacts the first electrically conductive layer and the substrate.

Next, at a step 2650, the first electrically insulative layer is etched to expose a portion of the substrate, and at a step 2655, a third electrically conductive layer is thermally grown over the substrate and over the portion of the second electrically conductive layer. The third electrically conductive layer is preferably comprised of at least silicon and germanium. Then, at a step 2660, an emitter region and a portion of a collector region are formed, and at a step 2665, base, emitter, and collector contacts are formed.

Therefore, an improved method of manufacturing a semiconductor component and semiconductor component thereof is provided to overcome the disadvantages of the prior art. The method of manufacturing the semiconductor component is compatible with existing semiconductor processing techniques, and the resulting semiconductor component has superior high frequency performance characteristics.

Although the invention has been described with reference to specific embodiments, it will be understood by those skilled in the art that various changes may be made without departing from the spirit or scope of the invention. For instance, the numerous details set forth herein such as, for example, the material compositions, the doping concentrations, and the layer thicknesses are provided to facilitate the understanding of the invention and are not provided to limit the scope of the invention. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A method of manufacturing a semiconductor component comprising:

providing a substrate, a first electrically insulative layer over the substrate, and a first electrically conductive layer over the first electrically insulative layer;

etching a hole into a portion of the first electrically conductive layer and into a portion of the first electrically insulative layer;

depositing a second electrically conductive layer in the hole;

etching the first and second electrically conductive layers to leave a portion of the second electrically conductive layer in the hole;

growing a third electrically conductive layer over the substrate and extending over the portion of the second electrically conductive layer, where the second electrically conductive layer is electrically coupled to the third electrically conductive layer;

providing a second electrically insulative layer over the first electrically conductive layer;

etching a hole in the second electrically insulative layer;

forming a spacer in the hole in the second electrically insulative layer and over the portion of the first electrically conductive layer;

forming a third electrically insulative layer over the first electrically conductive layer and adjacent to the spacer; and removing the spacer after forming the third electrically insulative layer.

2. The method of claim 1 wherein:

etching the hole into the portion of the first electrically insulative layer and into the portion of the first electrically insulative layer occurs after removing the spacer.

3. The method of claim wherein:

depositing the second electrically conductive layer further comprises:

depositing the second electrically conductive layer over the second electrically insulative layer.

4. The method of claim 1 wherein:

etching the hole into the portion of the first electrically conductive layer and into the portion of the first electrically insulative layer further comprises:

etching the first electrically conductive layer; and using the third electrically insulative layer as an etch mask while etching the first electrically conductive layer.

5. The method of claim 1 wherein:

etching the hole into the portion of the first electrically conductive layer and into the portion of the first electrically insulative layer further comprises:

etching the first electrically insulative layer; and removing the third electrically insulative layer while etching the first electrically insulative layer.

6. The method of claim 1 wherein:

forming the third electrically insulative layer further comprises:

thermally growing a silicon dioxide layer over the first electrically conductive layer.

7. A method of manufacturing a heterojunction bipolar transistor comprising:

providing a substrate, a first electrically insulative layer over the substrate, and a first electrically conductive layer on the first electrically insulative layer;

etching a hole in a portion of the first electrically conductive layer;

extending the hole into a portion of the first electrically insulative layer;

depositing a second electrically conductive layer over the first electrically conductive layer, in the hole, and on the substrate;

etching the first and second electrically conductive layers to leave a portion of the second electrically conductive layer in the hole, contacting the first electrically conductive layer, and on the substrate;

etching the first electrically insulative layer after etching the first and second electrically conductive layers;

growing a third electrically conductive layer on the substrate and on the portion of the second electrically conductive layer;

providing a second electrically insulative layer over the first electrically conductive layer;

etching a first hole in the second electrically insulative layer, the hole having a side wall;

forming a spacer along the side wall of the first hole, over the portion of the first electrically conductive layer, and over the portion of the first electrically insulative layer;

growing a third electrically insulative layer on the first electrically conductive layer and adjacent to the spacer; and removing the spacer after forming the third electrically insulative layer, wherein:

etching the hole in the portion of the first electrically insulative layer occurs after removing the spacer; and depositing the second electrically conductive layer further comprises:

depositing the second electrically conductive layer over the second electrically insulative layer.

8. The method of claim 7 wherein:

etching the hole in the portion of the first electrically conductive layer further comprises:

etching the first electrically conductive layer; and using the third electrically insulative layer as an etch mask while etching the first electrically conductive layer; and extending the hole into the first electrically insulative layer further comprises:

etching the first electrically insulative layer; and removing the third electrically insulative layer while etching the first electrically insulative layer.

9. The method of claim 7 wherein:

providing the first electrically conductive layer further comprises:

providing a doped silicon layer for the first electrically conductive layer; and growing the third electrically insulative layer further comprises:

thermally growing a silicon dioxide layer over the first electrically conductive layer.

* * * * *